United States Patent
Nakai et al.

(10) Patent No.: US 8,581,104 B2
(45) Date of Patent: Nov. 12, 2013

(54) WIRING BOARD AND METHOD FOR MANUFACTURING THE SAME

(75) Inventors: Toru Nakai, Ogaki (JP); Tetsuo Amano, Ogaki (JP); Yoshinori Takasaki, Ogaki (JP)

(73) Assignee: Ibiden Co., Ltd., Ogaki-shi (JP)

(*) Notice: Subject to any disclaimer, the term of this patent is extended or adjusted under 35 U.S.C. 154(b) by 401 days.

(21) Appl. No.: 12/981,709

(22) Filed: Dec. 30, 2010

(65) Prior Publication Data

US 2011/0240358 A1 Oct. 6, 2011

Related U.S. Application Data

(60) Provisional application No. 61/319,533, filed on Mar. 31, 2010.

(51) Int. Cl.
*H05K 1/03* (2006.01)

(52) U.S. Cl.
USPC .......................................... 174/255

(58) Field of Classification Search
USPC .......................................... 174/255
See application file for complete search history.

(56) References Cited

U.S. PATENT DOCUMENTS

| | | | |
|---|---|---|---|
| 6,835,895 B1 * | 12/2004 | Asai et al. ................. | 174/255 |
| 7,449,781 B2 | 11/2008 | Nakai | |
| 7,804,031 B2 | 9/2010 | Nakai et al. | |
| 2009/0065243 A1 | 3/2009 | Nakai | |
| 2009/0107711 A1 | 4/2009 | Nakai et al. | |
| 2009/0218125 A1 | 9/2009 | Nakai et al. | |
| 2010/0038124 A1 * | 2/2010 | Liu et al. ................. | 174/262 |
| 2010/0252308 A1 | 10/2010 | Nakai et al. | |

FOREIGN PATENT DOCUMENTS

| | | |
|---|---|---|
| JP | 11-214828 | 8/1999 |
| JP | 2003-188496 | 7/2003 |
| JP | 2005-5458 | 1/2005 |
| JP | 2007-165634 | 6/2007 |
| JP | 2009-200500 | 9/2009 |

* cited by examiner

*Primary Examiner* — Jeremy Norris
(74) *Attorney, Agent, or Firm* — Oblon, Spivak, McClelland, Maier & Neustadt, L.L.P.

(57) ABSTRACT

A wiring board includes an insulation layer containing a resin and a silica-type filler and having a roughened surface, and a conductive layer formed on the roughened surface of the insulation layer and having a first conductive portion and a second conductive portion positioned adjacent to the first conductive portion. The roughened surface of the insulation layer has a roughness under the first conductive portion, a roughness under the second conductive portion, and a roughness between the first conductive portion and the second conductive portion, and the roughness between the first conductive portion and the second conductive portion is set less than at least one of the roughness under the first conductive portion and the roughness under the second conductive portion.

20 Claims, 18 Drawing Sheets

| SiO$_2$(wt%) | result of laser irradiation |
|---|---|
| 0 | carbonization observed |
| 15 | carbonization observed |
| 30 | carbonization not observed |
| 50 | carbonization not observed |

WIRING BOARD AND METHOD FOR MANUFACTURING THE SAME

CROSS-REFERENCE TO RELATED APPLICATIONS

The present application claims the benefits of priority to U.S. Application No. 61/319,533, filed Mar. 31, 2010. The contents of that application are incorporated herein by reference in their entirety.

BACKGROUND OF THE INVENTION

1. Field of the Invention

The present invention relates to a wiring board that is useful when mounted, for example, in a cell phone, a personal computer or the like, and to a method for manufacturing such a wiring board.

2. Discussion of the Background

In Japanese Laid-Open Patent Publication H11-214828, a wiring board is described in which conductive circuits are formed on an insulation layer that has a roughened surface. The conductive circuits are made up of electroless plated film and electrolytic plated film. As for the method for forming such conductive circuits, a semi-additive method is employed. Namely, a surface of an insulation layer is roughened and electroless plated film is formed on the roughened surface. Next, plating resist is formed on the electroless plated film and electrolytic plated film is formed on portions where the plating resist is not formed. Then, the plating resist is removed and the electroless plated film under the plating resist is etched away. Conductive circuits are formed on the insulation layer that has a roughened surface.

The contents of Japanese Laid-Open Patent Publication No. H11-214828 are incorporated herein by reference in their entirety in the present application.

SUMMARY OF THE INVENTION

According to one aspect of the present invention, a wiring board includes an insulation layer containing a resin and a silica-type filler and having a roughened surface, and a conductive layer formed on the roughened surface of the insulation layer and having a first conductive portion and a second conductive portion positioned adjacent to the first conductive portion. The roughened surface of the insulation layer has a roughness under the first conductive portion, a roughness under the second conductive portion, and a roughness between the first conductive portion and the second conductive portion, and the roughness between the first conductive portion and the second conductive portion is set less than at least one of the roughness under the first conductive portion and the roughness under the second conductive portion.

According to another aspect of the present invention, a wiring board includes an insulation layer containing a resin and a silica-type filler and having a roughened surface, and a conductive layer formed on the roughened surface of the insulation layer and having a first conductive portion and a second conductive portion positioned adjacent to the first conductive portion. The roughened surface is recessed between the first conductive portion and the second conductive portion with respect to a portion of the roughened surface under the first conductive portion and/or a portion of the roughened surface under the second conductive portion.

According to yet another aspect of the present invention, a wiring board includes an insulation layer containing a resin and a silica-type filler and a roughened surface, and a conductive layer formed on the roughened surface of the insulation layer and having a first conductive portion and a second conductive portion positioned adjacent to the first conductive portion. The conductive layer includes an electroless plated film and an electrolytic plated film, and a portion of the roughened surface of the insulation layer between the first conductive portion and the second conductive portion has a catalyst for forming the electroless plated film in the amount of approximately 0.05 μg/cm$^2$ or less.

According to still another aspect of the present invention, a wiring board includes an insulation layer containing a resin and a silica-type filler and having a roughened surface, and a conductive layer formed on the roughened surface of the insulation layer and including an electroless plated film and an electrolytic plated film. The conductive layer has a conductor portion made of the electroless plated film and the electrolytic plated film, and the conductor portion of the conductive layer has a side surface which makes an angle of 90 degrees or greater with the roughened surface.

According to still another aspect of the present invention, a wiring board includes an insulation layer containing a resin and a silica-type filler and having a roughened surface, a conductive layer formed on the roughened surface of the insulation layer and including an electroless plated film and an electrolytic plated film, and a modification layer formed on an electrolytic plated film.

According to still another aspect of the present invention, a method for manufacturing a wiring board includes preparing an insulation layer containing a resin and a silica-type filler and having a roughened surface, forming an electroless plated film on the roughened surface of the insulation layer, forming an electrolytic plated film on portions of the electroless plated film, and removing the electroless plated film except the portions of the electroless plated film having the electrolytic plated film formed thereon by laser irradiation such that the silica-type filler works as a stopper.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
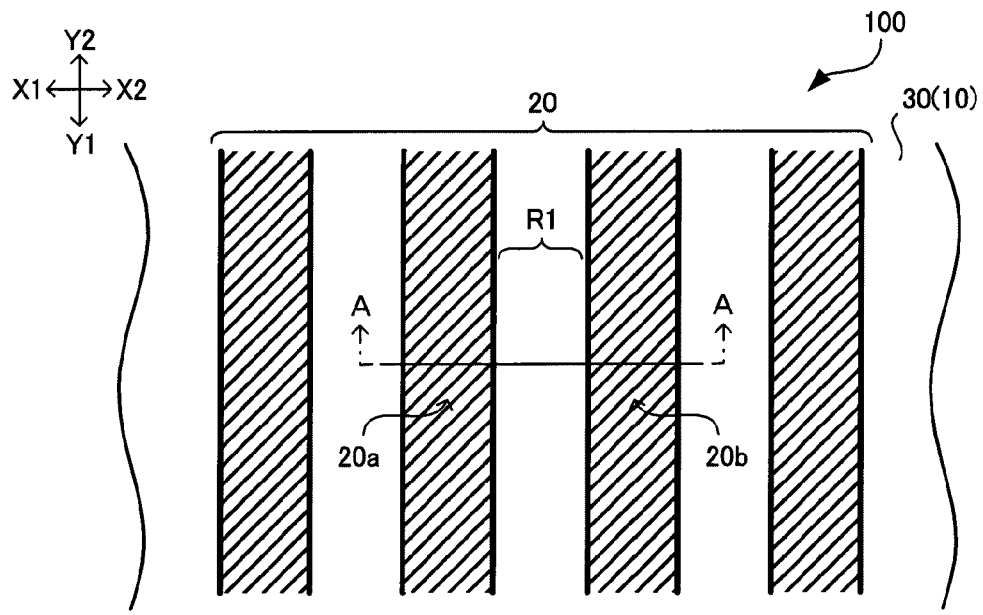
FIG. 1 is a plan view of a wiring board according to an embodiment of the present invention.

The embodiments will now be described with reference to the accompanying drawings, wherein like reference numerals designate corresponding or identical elements throughout the various drawings.

In the drawings, arrows (Z1, Z2) each indicate a lamination direction in a wiring board, corresponding to a direction along a normal line (or a direction of the thickness of a core substrate) to the main surfaces (upper and lower surfaces) of the wiring board. On the other hand, arrows (X1, X2) and (Y1, Y2) each indicate a direction perpendicular to a lamination direction (directions parallel to the main surfaces of the wiring board). The main surfaces of a wiring board are on the X-Y plane. Side surfaces of a wiring board are on the X-Z plane or the Y-Z plane.

In the present embodiment, two main surfaces facing opposite directions of a normal line are referred to as a first surface (the Z1-side surface) and a second surface (the Z2-side surface). Namely, a main surface opposite the first surface is the second surface, and a main surface opposite the second surface is the first surface. In lamination directions, the side closer to the core is referred to as a lower layer (or inner-layer side), and the side farther away from the core is referred to as an upper layer (or outer-layer side).

Aside from the layers containing conductive patterns that function as wiring such as circuits (including ground), layers made of a plain pattern are also referred to as conductive layers. Among conductors formed in holes, conductive film formed on the wall surfaces of a hole (side surface and bottom surface) is referred to as conformal conductor, and conductor filled in a hole is referred to as filled conductor. In addition to the above conductive patterns, conductive layers may include lands of connection conductors.

Plating indicates depositing conductors (such as metal) to form layers on metal or resin surfaces as well as such deposited conductive layers (such as metal layers). Other than wet plating such as electrolytic plating and electroless plating, plating also includes dry plating such as PVD (Physical Vapor Deposition) and CVD (Chemical Vapor Deposition).

Laser light is not limited to visible light. Along with visible light, laser light also includes electromagnetic waves of short wavelength such as ultraviolet light and X-rays, and electromagnetic waves of long wavelength such as infrared rays.

Regarding line patterns formed on a surface (wiring on the surface or grooves under the surface), among the directions that intersect with a line at a right angle, the measurement in a direction parallel to the surface where the line is formed is referred to as "width," and the measurement in a direction perpendicular to the surface where the line is formed is referred to as "height" or "thickness" or "depth." In addition, the measurement from one end of the line to the other end is referred to as "length." However, the measurements are not limited to the above if indicated otherwise.

Figure 2:
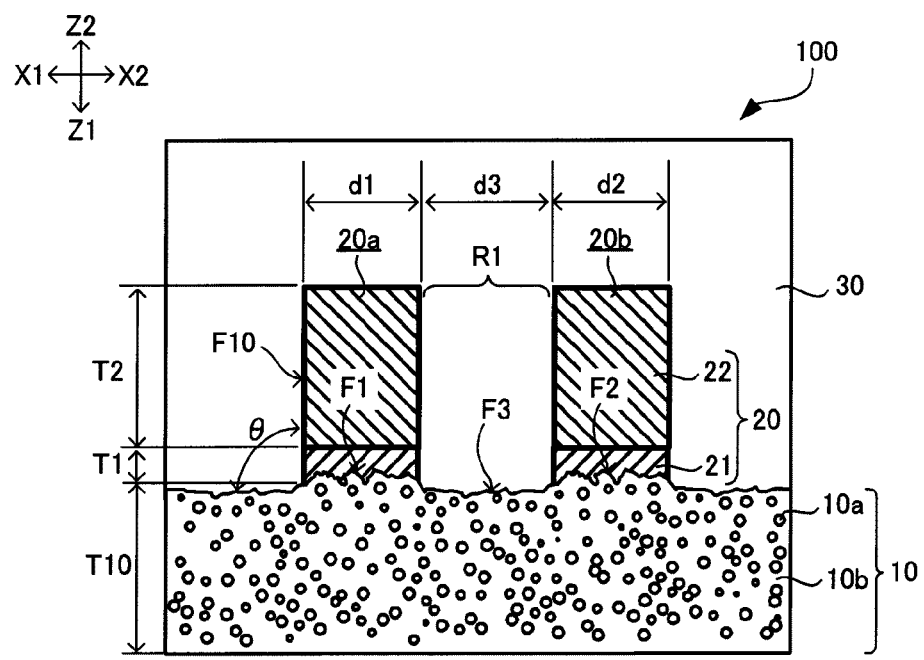
FIG. 2 is a cross-sectional view taken from the A-A line in FIG. 1.
Figure 3:
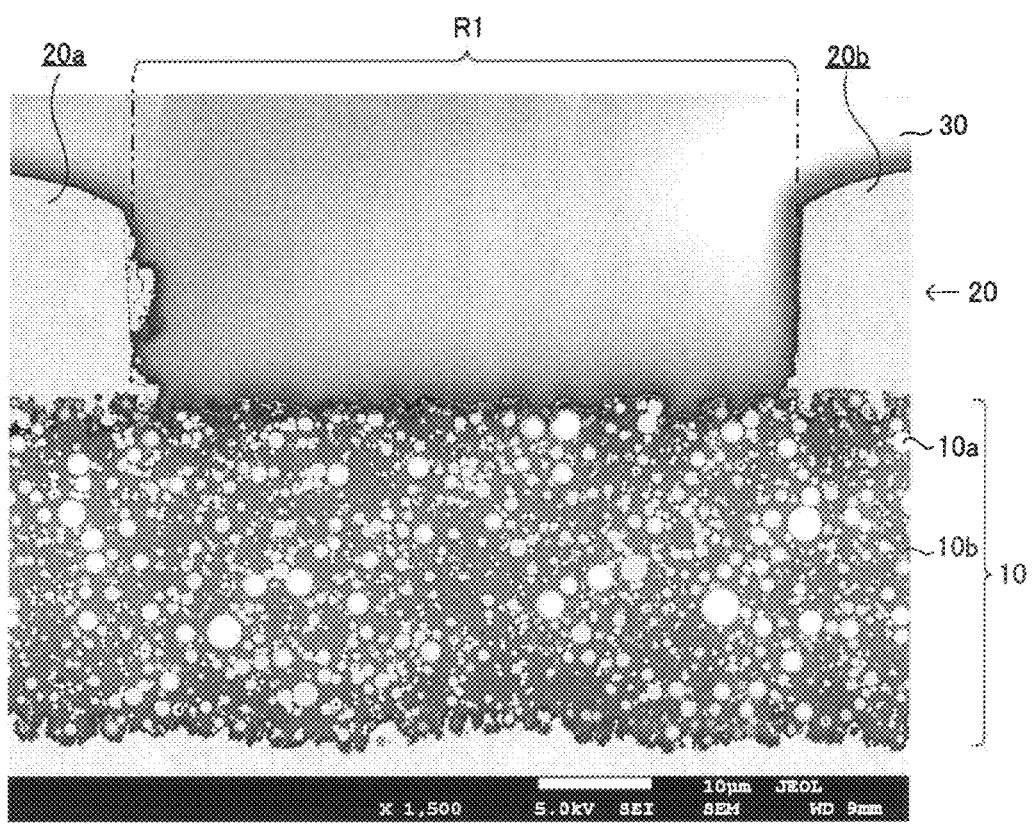
FIG. 3 is an SEM (Scanning Electron Microscope) photograph of a wiring board according to an embodiment of the present invention.

Wiring board 100 of the present embodiment has insulation layer 10, conductive layer 20 and upper insulation layer 30 as shown in FIG. 1, FIG. 2 (a cross-sectional view taken from the A-A line in FIG. 1) and FIG. 3 (an SEM photograph).

Thickness (T10) of insulation layer 10 is preferred to be in an approximate range of 5~200 μm. Setting thickness (T10)

in such a range makes it advantageous to ensure insulation reliability and to avoid unnecessary board thickness.

Insulation layer 10 contains filler (10a) and resin (10b). Insulation layer 10 may be formed by combining filler (10a) with resin (10b). In the present embodiment, filler (10a) is dispersed substantially uniformly in substantially the entire insulation layer 10. However, insulation layer 10 is not limited to such and filler (10a) may also be embedded only in the surface-layer portion of insulation layer 10 (for example, see later-described FIG. 32).

In the present embodiment, filler (10a) is made of a silica-type filler. As for a silica-type filler, silicate minerals are preferred. Especially, at least one of the following is preferred to be used: silica, talc, mica, kaolin or calcium silicate. In addition, as for silica, at least one of the following is preferred to be used: spherical silica, fragmented silica, fused silica or crystalline silica.

The maximum particle diameter of filler (10a) (a silica-type filler) contained in insulation layer 10 is preferred to be approximately 10 μm or less. In the present embodiment, the maximum particle diameter of filler (10a) (a silica-type filler) is approximately 3.4 μm.

Figure 16A:
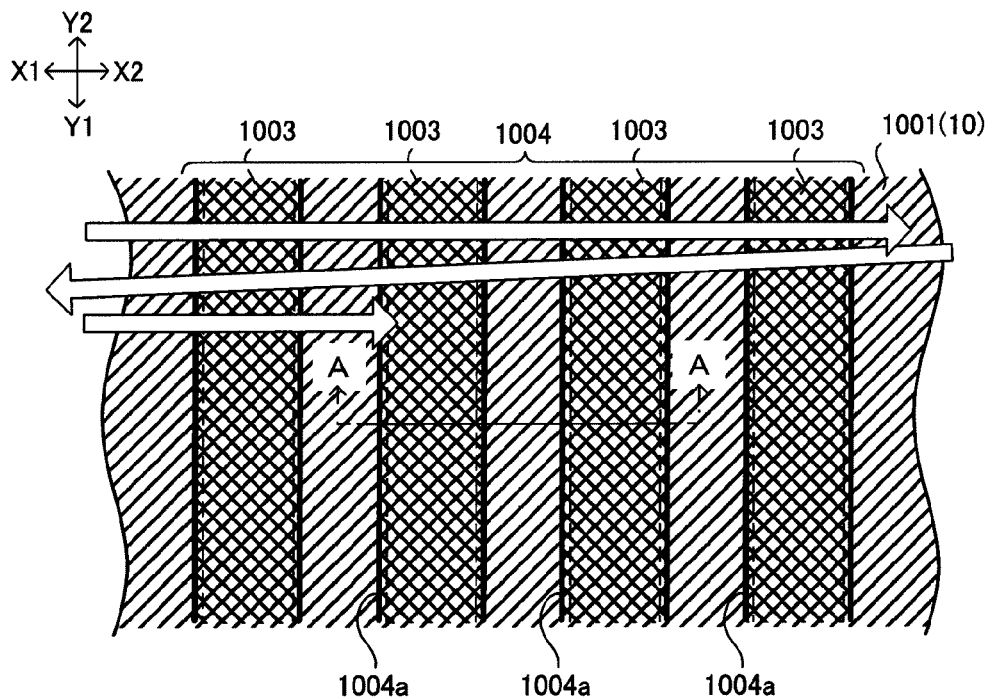
FIG. 16A is a view to illustrate a laser irradiation step for removing unnecessary electroless plated film.
Figure 16B:
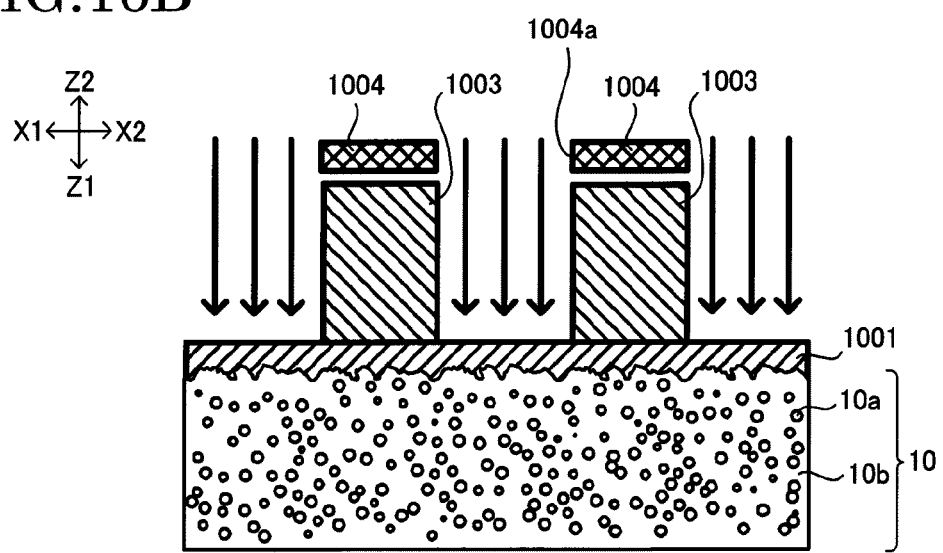
FIG. 16B is a cross-sectional view taken from the A-A line in FIG. 16A.

In the present embodiment, more than 50 wt. % of filler (10a) (a silica-type filler) is spherical filler. If the primary ingredient (more than half) of filler (10a) is spherical silica as above, it is thought that filler (10a) works preferably as a stopper in the later-described laser irradiation step (FIGS. 16A and 16B). Also, as a result, it is thought that conductors or catalyst tends not to remain on insulation layer 10. However, the material or the like of filler (10a) is not limited specifically. For example, silica (10a) is not required to contain spherical silica.

In the present embodiment, resin (10b) is made of epoxy resin. Epoxy resin is a thermosetting resin. As for thermosetting resins, the following may be used instead of epoxy resin: phenol resin, polyphenylene ether (PPE), polyphenylene oxide (PPO), fluororesin, LCP (liquid-crystal polymer), polyester resin, imide resin (polyimide), BT resin, allyl polyphenylene ether resin (A-PPE resin), aramid resin and the like.

In insulation layer 10, resin (10b) (thermosetting resin) is preferred to contain filler (10a) (a silica-type filler) at approximately 30 wt. % or more. If the amount of filler (10a) in insulation layer 10 is in such a range, it is thought that filler (10a) works preferably as a stopper in the later-described laser irradiation step (FIGS. 16A and 16B) and that carbonization of resin (10b) is suppressed (see later-described FIG. 24).

The second surface of insulation layer 10 is roughened, and conductive layer 20 is formed on the second surface (roughened surface) of insulation layer 10.

Conductive layer 20 is a double layer of electroless plated film 21 and electrolytic plated film 22, for example. However, conductive layer 20 is not limited to such and may be formed with three or more layers, for example. Thickness (T1) of electroless plated film 21 is approximately 0.6 μm, for example, and thickness (T2) of electrolytic plated film 22 is approximately 15 μm, for example.

In the present embodiment, electroless plated film 21 and electrolytic plated film 22 are made of copper. When forming electroless plated film 21, palladium is used as a catalyst. However, electroless plated film 21 and electrolytic plated film 22 are not limited to such, and they may be formed using other material (for example, metals other than copper). The type of catalyst is not limited specifically. Also, it is not required to use a catalyst unless necessary.

As shown in FIG. 2, conductive layer 20 includes conductive portion (20a) (first conductive portion) and conductive portion (20b) (second conductive portion).

As shown in FIG. 1, conductive portions (20a, 20b) are formed in a straight line in the present embodiment. Conductive portion (20a) and conductive portion (20b) are positioned substantially parallel to each other and insulated from each other. However, the conductive pattern of conductive layer 20 is not limited to such and may be formed freely (for example, see later-described FIGS. 30 and 31).

An example of widths (d1, d2) is shown: width (d1) of conductive portion (20a) is approximately 10 μm, for example; and width (d2) of conductive portion (20b) is approximately 10 μm, for example. The structure shown in FIGS. 1 and 2 is thought to suppress short circuiting between adjacent wiring lines. Therefore, such a structure is especially effective when forming highly integrated fine wiring patterns such as width (d1) of conductive portion (20a) and width (d2) of conductive portion (20b) set at approximately 10 μm or less.

Space (R1) is formed between conductive portion (20a) and conductive portion (20b). In an example, width (D2) of space (R1) (distance between conductive portion (20a) and conductive portion (20b)) is approximately 10 μm, for example. The structure shown in FIGS. 1 and 2 is thought to suppress short circuiting between adjacent wiring lines. Therefore, such a structure is especially effective when forming highly integrated fine wiring patterns such as width (D2) of space (R1) set at approximately 10 μm or less.

On the second surface of insulation layer 10, the roughness of surface (F3) between conductive portion (20a) and conductive portion (20b) (space R1) is preferred to be set smaller than the roughness of surface (F1) under conductive portion (20a) and the roughness of surface (F2) under conductive portion (20b). If the roughness of surface (F3) is small, it is thought that spaces (voids) that cause cracks tend not to remain between insulation layer 10 and upper insulation layer 30. Also, on surface (F3), since conductor (electroless plated film), catalyst and the like tend not to remain in recessed portions of surface (F3), it is thought that insulation reliability improves between adjacent wiring lines (conductive portions (20a) and (20b)) in conductive layer 20. Here, if the roughness of surface (F3) is less than at least either the roughness of surface (F1) or the roughness of surface (F2), substantially the same effects as above are thought to be achieved.

The ten-point mean roughness (Rz) of surface (F3) between conductive portion (20a) and conductive portion (20b) (space R1) is approximately half or less than half the ten-point mean roughness (Rz) of surface (F1) under conductive portion (20a), and also approximately half or less than half the ten-point mean roughness (Rz) of surface (F2) under conductive portion (20b). In such an example, substantially the same effects as above are achieved since the roughness of surface (F3) is slight. In addition, even if the ten-point mean roughness (Rz) of surface (F3) is approximately half or less than half the ten-point mean roughness (Rz) of either surface (F1) or surface (F2), it is thought that similar effects are achieved.

Figure 4A:
FIG. 4A is a view showing a surface between conductive portions of a wiring board shown in FIGS. 1 and 2.
Figure 4B:
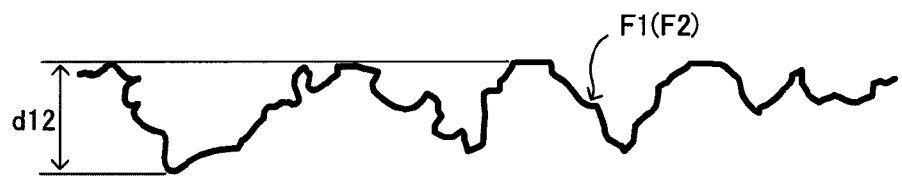
FIG. 4B is a view showing a surface under conductive portions of a wiring board shown in FIGS. 1 and 2.

An example of the roughness of surfaces (F1)~(F3) is shown as follows: In FIG. 4A, Rmax (d11) of surface (F3) is approximately 1.90 μm, for example, and the ten-point mean roughness (Rz) of surface (F3) is approximately 1.75 μm, for example. Also, in FIG. 4B, Rmax (d12) of surface (F1) or (F2) is approximately 3.80 μm, for example, and the ten-point mean roughness (Rz) of surface (F1) or (F2) is approximately 3.50 μm, for example.

In the present embodiment, the ten-point mean roughness (Rz) (for example, approximately 1.75 μm) of surface (F3) between conductive portion (20a) and conductive portion (20b) (space R1) is set the same as or smaller than the maximum particle diameter (for example, approximately 3.4 μm) of filler (10a) (a silica-type filler) contained in insulation layer 10. It is thought that the above roughness is obtained as a result of laser irradiation using filler (10a) as a stopper in the manufacturing process (a detailed description will be provided later).

In the present embodiment, a modification layer is formed on the outer side of electrolytic plated film 22. Before the modification layer is formed, the surface looks rugged because of crystalline particle lumps in the plating. However, by forming the modification layer, such a rugged surface caused by crystalline particle lumps in the plating disappears and the surface looks smooth (see later-described FIG. 25). Accordingly, it is thought that electrical characteristics improve especially in a high-frequency range where a skin effect tends to occur.

Figure 5:
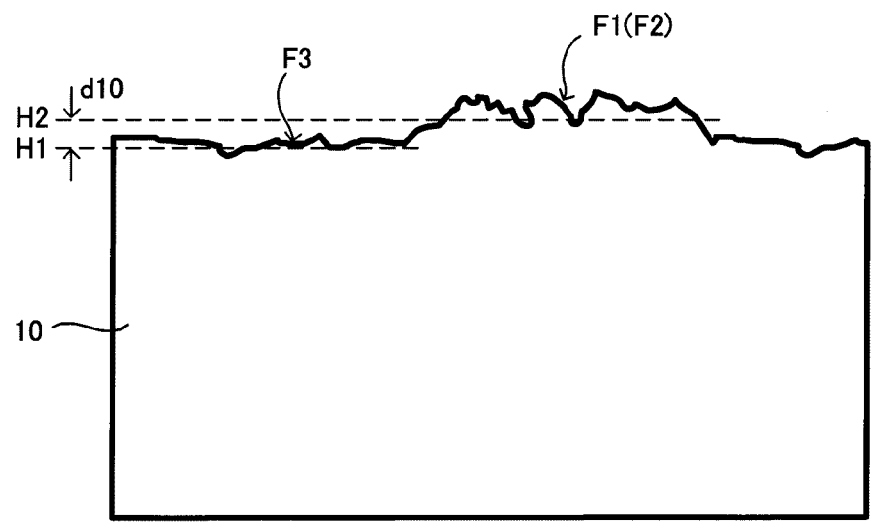
FIG. 5 is a view showing that the surface between conductive portions is recessed from the surface under the conductive portions.

On the second surface of insulation layer 10, surface (F3) between conductive portion (20a) and conductive portion (20b) (space R1) is recessed from surface (F1) under conductive portion (20a) and surface (F2) under conductive portion (20b). Accordingly, the contact area increases between the second surface of insulation layer 10 and upper insulation layer 30, and it is thought that the risk of interlayer peeling (delamination) decreases. In particular, in FIG. 5, the difference (level difference d10) between height (H1) of surface (F3) (for example, ten-point mean roughness (Rz)) and height (H2) of surface (F1) or (F2) (for example, ten-point mean roughness (Rz)) is preferred to be approximately 0.7 μm, for example.

The amount of the catalyst (palladium) to form electroless plated film 21 on surface (F3) (surface-layer portion) between conductive portion (20a) and conductive portion (20b) (space R1) is preferred to be approximately 0.05 μg/cm² or less. In wiring board 100 of the present embodiment, there is hardly any palladium on surface (F3) (surface-layer portion) (see later-described FIG. 23). Accordingly, it is thought that the risk of an abnormal amount of Ni or the like deposited on surface (F3) using palladium as nuclei decreases.

In FIG. 1, angle θ made by the second surface (roughened surface) of insulation layer 10 and side surfaces (F10) of conductive portions (20a, 20b) is preferred to be approximately 90 degrees or greater. In the present embodiment, angle θ is substantially 90 degrees. Namely, substantially no undercut is formed in wiring board 100 of the present embodiment. Therefore, a decrease in quality caused by undercut does not occur, and it is thought that excellent electrical characteristics are achieved (for more detail, see later-described FIGS. 19-21). Angle θ is not limited to approximately 90 degrees. For example, as long as angle θ is approximately 90 degrees or greater, undercutting does not occur and it is thought that substantially the same effects as above are achieved.

Upper insulation layer 30 is formed on insulation layer 10 to coat conductive portions (20a, 20b). Upper insulation layer 30 may be an interlayer insulation layer or a solder-resist layer, for example. However, upper insulation layer 30 is not limited to those, and any other usage or material may be employed for upper insulation layer 30.

Figure 6:
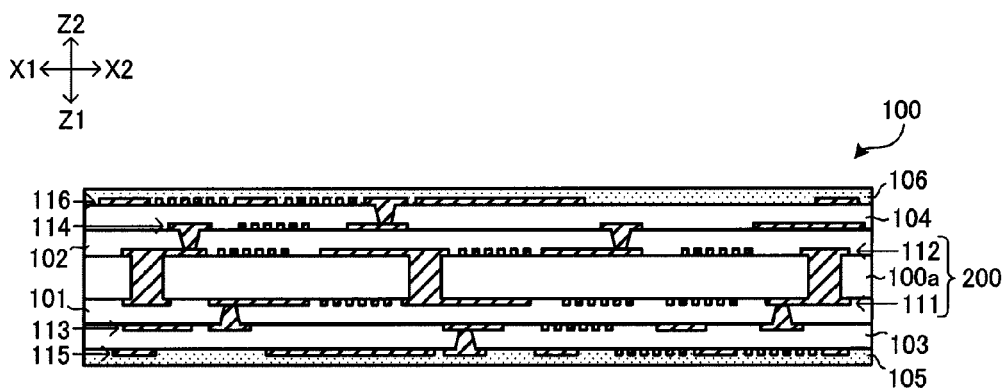
FIG. 6 is a view showing a first example of a wiring board according to an embodiment of the present invention.

Wiring board 100 of the present embodiment is preferred to be a multilayer printed wiring board (double-sided rigid wiring board) as shown in FIG. 6, for example. Wiring board 100 in an example shown in FIG. 6 has substrate 200 (core substrate), insulation layers 101~104 (interlayer insulation layers), solder-resist layers (105, 106) and conductive layers 113~116. Substrate 200 has insulation layer (100a) and conductive layers (111, 112). By mounting another wiring board or electronic component or the like on one surface or both surfaces of wiring board 100, wiring board 100 may be used, for example, as a circuit board for cell phones or the like.

Wiring board 100 may be manufactured, for example, by alternately building up insulation layers 101~104 and conductive layers 113~116 on substrate 200, and then by forming solder-resist layers (105, 106) on the outermost layers.

Substrate 200 may be manufactured, for example, by the steps shown in later-described FIGS. 10~16B. Also, a double-sided copper-clad laminate may be used as substrate 200. Insulation layers 101~104 may be formed (laminated) by the vacuum lamination of resin film (semi-cured adhesive sheet), for example. Conductive layers 113~116 may be formed by any one of the following methods—panel plating method, pattern plating method, full-additive method, semi-additive (SAP) method, subtractive method and tenting method—or by a method combining any two or more methods selected from among those methods. Solder-resist layers (105, 106) may be formed, for example, by screen printing or lamination or the like.

Figure 7A:
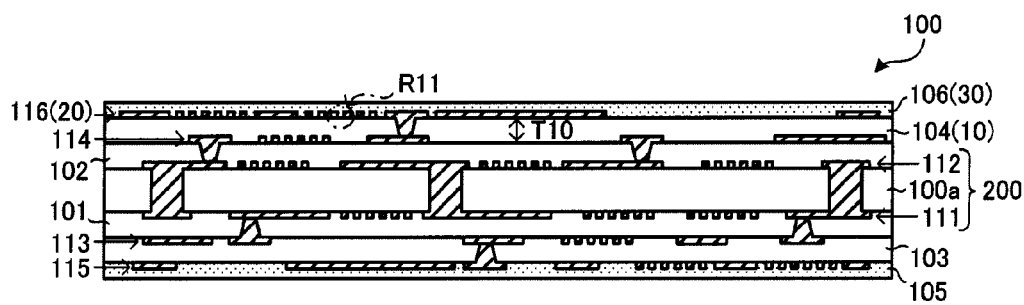
FIG. 7A is a view showing a first example in which the structure shown in FIGS. 1 and 2 is employed in the wiring board shown in FIG. 6.

The structure shown previously in FIGS. 1 and 2 may be employed as the structure of a built-up section of a multilayer printed wiring board, for example, for region (R11) in FIG. 7A. In an example shown in FIG. 7A, insulation layer 104 corresponds to insulation layer 10, conductive layer 116 corresponds to conductive layer 20, and solder-resist layer 106 corresponds to upper insulation layer 30.

Figure 7B:
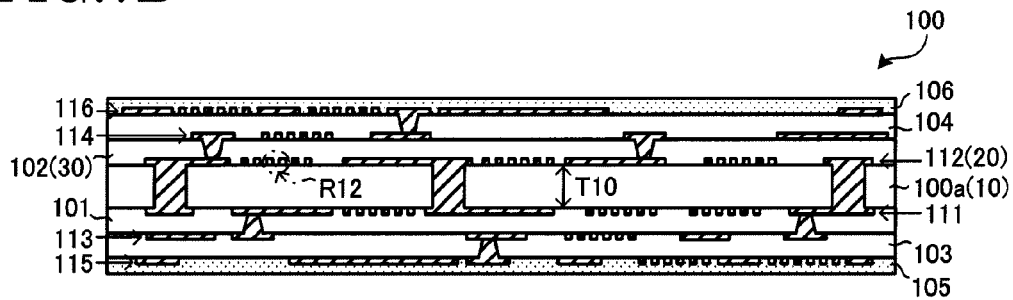
FIG. 7B is a view showing a second example in which the structure shown in FIGS. 1 and 2 is employed in the wiring board shown in FIG. 6.

Also, the structure shown previously in FIGS. 1 and 2 may be employed as the structure of a core section in a multilayer printed wiring board, for example, for region (R12) in FIG. 7B. In the example in FIG. 7B, insulation layer (100a) (core) corresponds to insulation layer 10, conductive layer 112 corresponds to conductive layer 20, and insulation layer 102 (interlayer insulation layer) corresponds to upper insulation layer 30.

Figure 8:
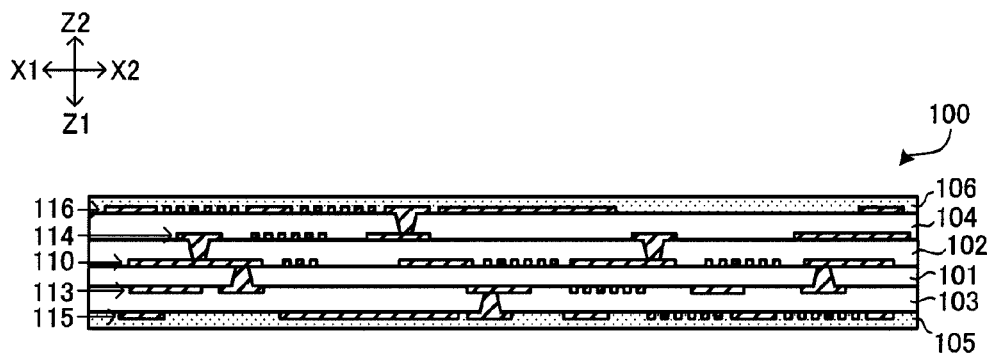
FIG. 8 is a view showing a second example of a wiring board according to an embodiment of the present invention.

The structure and others of wiring board 100 are not limited to an example shown in FIG. 6. For example, as shown in FIG. 8, it may be a multilayer printed wiring board without substrate 200 (core substrate) (double-sided rigid wiring board). In the example shown in FIG. 8, conductive layer 110 is set as a base (core position), and two layers of insulation layers (101, 103) and two layers of conductive layers (113, 115) are alternately laminated on the first-surface side; and two layers of insulation layers (102, 104) and two layers of conductive layers (114, 116) are alternately laminated on the second-surface side. Then, the outermost layer on the first-surface side (insulation layer 103 and conductive layer 115) is covered by solder-resist layer 105; and the outermost layer on the second-surface side (insulation layer 104 and conductive layer 116) is covered by solder-resist layer 106.

Figure 9A:
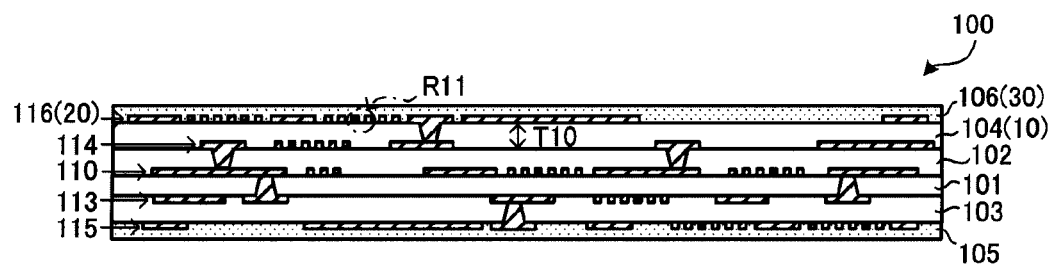
FIG. 9A is a view showing a first example in which the structure shown in FIGS. 1 and 2 is employed in the wiring board shown in FIG. 8.

The structure shown previously in FIGS. 1 and 2 may be employed as the structure of region (R11) in FIG. 9A, for example. In an example shown in FIG. 9A, insulation layer 104 corresponds to insulation layer 10, conductive layer 116 corresponds to conductive layer 20, and solder-resist layer 106 corresponds to upper insulation layer 30.

Figure 9B:
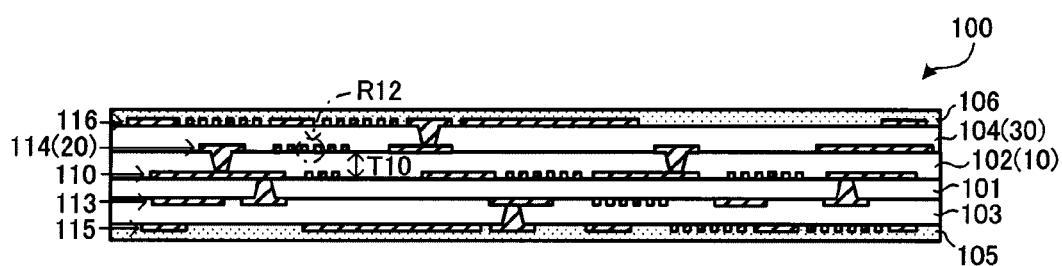
FIG. 9B is a view showing a second example in which the structure shown in FIGS. 1 and 2 is employed in the wiring board shown in FIG. 8.

Also, the structure shown previously in FIGS. 1 and 2 may be employed as the structure of a core section of a multilayer printed wiring board, for example, for region (R12) in FIG. 9B. In an example shown in FIG. 9B, insulation layer 102 corresponds to insulation layer 10, conductive layer 114 corresponds to conductive layer 20, and insulation layer 104 corresponds to upper insulation layer 30.

In addition, wiring board 100 may be a rigid wiring board or a flexible wiring board. Also, wiring board 100 may be a double-sided wiring board or a single-sided wiring board. The number of conductive layers and insulation layers is not limited specifically.

Above wiring board 100 (especially the structure shown in FIGS. 1 and 2) is manufactured by the following method, for example.

Insulation layer 10 where at least the second surface is roughened is prepared.

Figure 10:
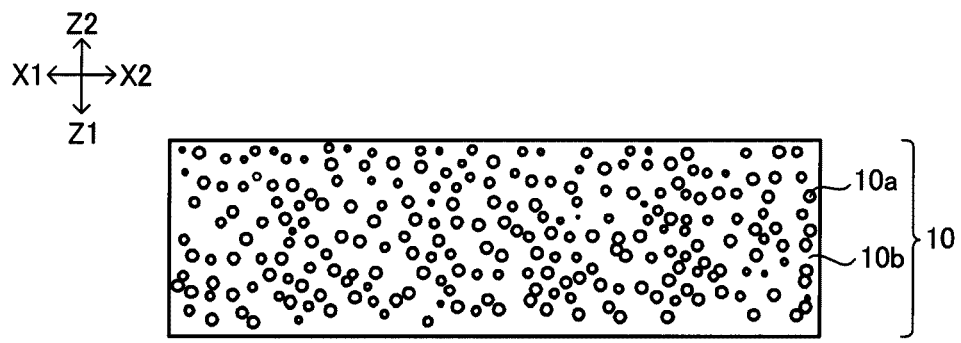
FIG. 10 is a view to illustrate a step for preparing an insulation layer.

More specifically, insulation layer 10 is prepared as shown in FIG. 10. Insulation layer 10 is made by combining filler (10*a*) (a silica-type filler) with resin (10*b*) (thermosetting resin) at approximately 30 wt. % or more.

Figure 11:
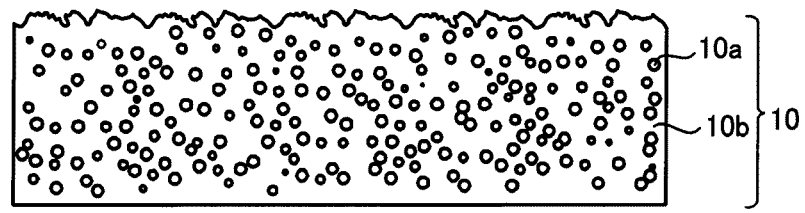
FIG. 11 is a view to illustrate a step for roughening a surface (second surface) of the insulation layer.

As shown in FIG. 11, the second surface of insulation layer 10 is roughened by etching, for example. In particular, the second surface of insulation layer 10 is etched by being immersed in a permanganic acid solution, for example. However, the method for roughening the surface is not limited to etching, and any other methods, such as polishing treatment, oxidation treatment and oxidation/reduction treatment, may also be used to roughen the second surface of insulation layer 10.

As described above, insulation layer 10 is prepared and one of its surfaces (second surface) is roughened. As a result, insulation layer 10 with roughened second surface is completed.

A catalyst is adsorbed on the second surface (roughened surface) of insulation layer 10 by immersion, for example. The catalyst is palladium as previously described. For such immersion, for example, a solution of palladium chloride or palladium colloid may be used. To set the catalyst, thermal treatment may also be conducted after immersion.

Figure 12:
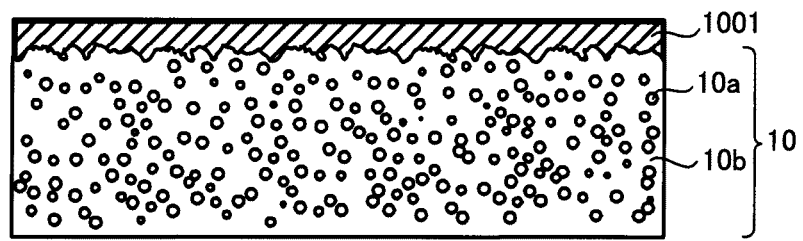
FIG. 12 is a view to illustrate a step for forming electroless plated film on the roughened surface of the insulation layer.

As shown in FIG. 12, electroless copper-plated film 1001, for example, is formed on the second surface (roughened surface) of insulation layer 10 by a chemical plating method, for example. As a plating solution, for example, a copper sulfate solution containing a reduction agent or the like may be used. As a reduction agent, for example, hypophosphite, glyoxylic acid or the like may be used.

Figure 13:
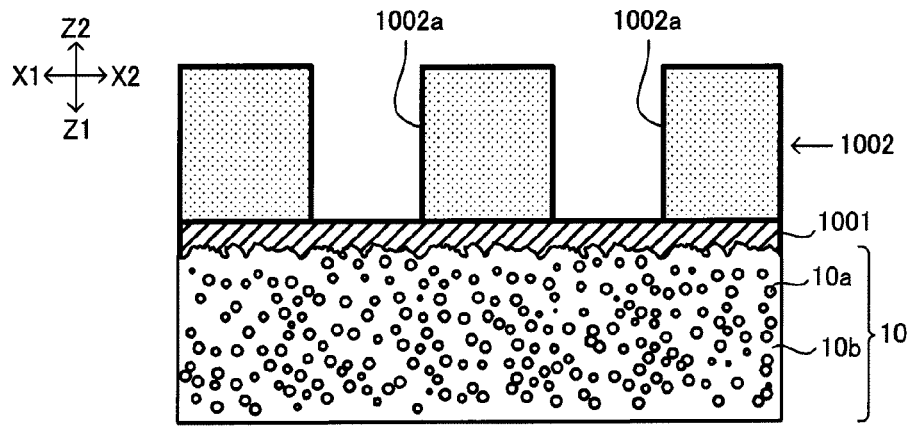
FIG. 13 is a view to illustrate a step for forming a plating resist on the electroless plated film.

As shown in FIG. 13, plating resist 1002 is formed on electroless plated film 1001. Plating resist 1002 has opening portions (1002*a*) at predetermined locations. Opening portions (1002*a*) are positioned to correspond to the conductive pattern of conductive layer 20 (FIG. 1).

Figure 14:
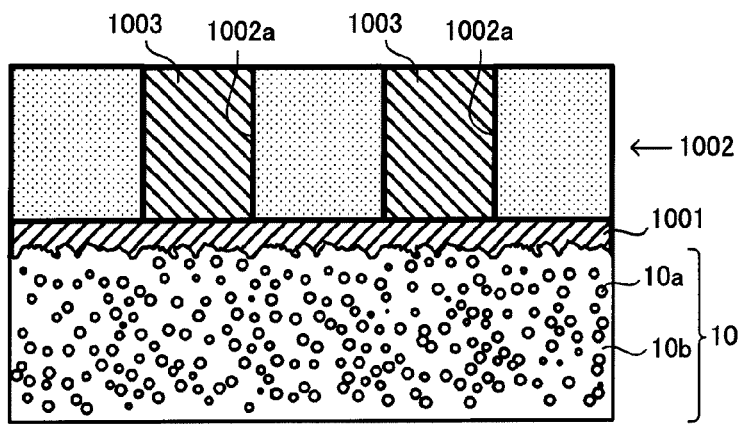
FIG. 14 is a view to illustrate a step for forming electrolytic plated film on portions of the electroless plated film.

As shown in FIG. 14, electrolytic copper-plated film 1003, for example, is formed in opening portions (1002*a*) of plating resist 1002 by a pattern plating method, for example. Specifically, copper as a plating material is connected to an anode, electroless plated film 1001 as the material to be plated is connected to a cathode, and then the insulation layer is immersed in a plating solution. Then, DC voltage is impressed and electric current is flowed between both electrodes, and copper is deposited on the exposed portions of the second surface of electroless plated film 1001 on the cathode side. Accordingly, electrolytic plated film 1003 is formed on portions of electroless plated film 1001. As a plating solution, for example, a copper sulfate solution, a copper pyrophosphate solution, a cyanide copper solution, a copper borofluoride solution or the like may be used.

Figure 15:
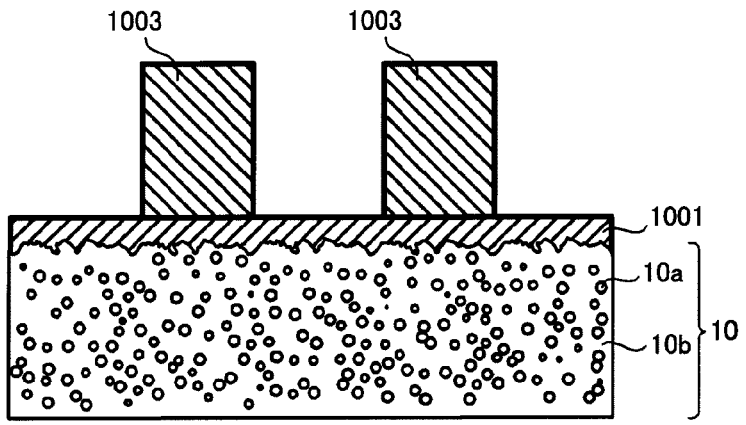
FIG. 15 is a view to illustrate a step for removing the plating resist.

As shown in FIG. 15, plating resist 1002 is removed by a predetermined delamination solution, for example.

By removing unnecessary electroless plated film 1001, conductive layer 20 with a conductive pattern as previously shown in FIG. 1 is formed. Specifically, for example, as shown in FIG. 16A (a plan view corresponding to FIG. 1) and FIG. 16B (a cross-sectional view taken from the A-A line in FIG. 16A), it is preferred that shading mask 1004 having opening portions (1004*a*) be arranged on the second-surface side of an object to be irradiated (insulation layer 10, etc.), and then the entire surface of the object (specifically, the entire second surface) be irradiated by a green laser. Here, a green laser indicates laser light with an approximate wavelength of 532 nm, which is a second harmonic of the fundamental wave with an approximate wavelength of 1,064 nm.

When such a green laser is irradiated on the entire surface of an object, it is preferred that the object be fixed and a green laser (precisely, the laser sight) be moved. Conversely, it is preferred that a green laser be fixed (precisely, the laser sight) and the object be moved. When moving a green laser, it is preferred that the green laser be moved (scanned) by a galvanomirror, for example. When moving an object, a green laser is set to be a line beam using a cylindrical lens, for example, which is then irradiated at predetermined portions while the object is moved by a conveyor.

Laser intensity (the amount of light) is preferred to be adjusted by pulse control. Specifically, for example, to modify laser intensity, the number of shots (irradiation number) is changed without changing laser intensity per shot (one irradiation). Namely, if required laser intensity is not obtained with one shot, laser light is irradiated again at the same irradiation spot. If such a control method is used, it is thought that the throughput improves since time for modifying irradiation conditions is omitted. However, adjusting laser intensity is not limited to the above, and any other method may be taken. For example, irradiation conditions are determined for each irradiation spot, and the irradiation number may be set constant (for example, one shot per one irradiation spot). Also, if multiple laser shots are irradiated at the same irradiation spot, the laser intensity may be modified for each shot.

Figure 17:
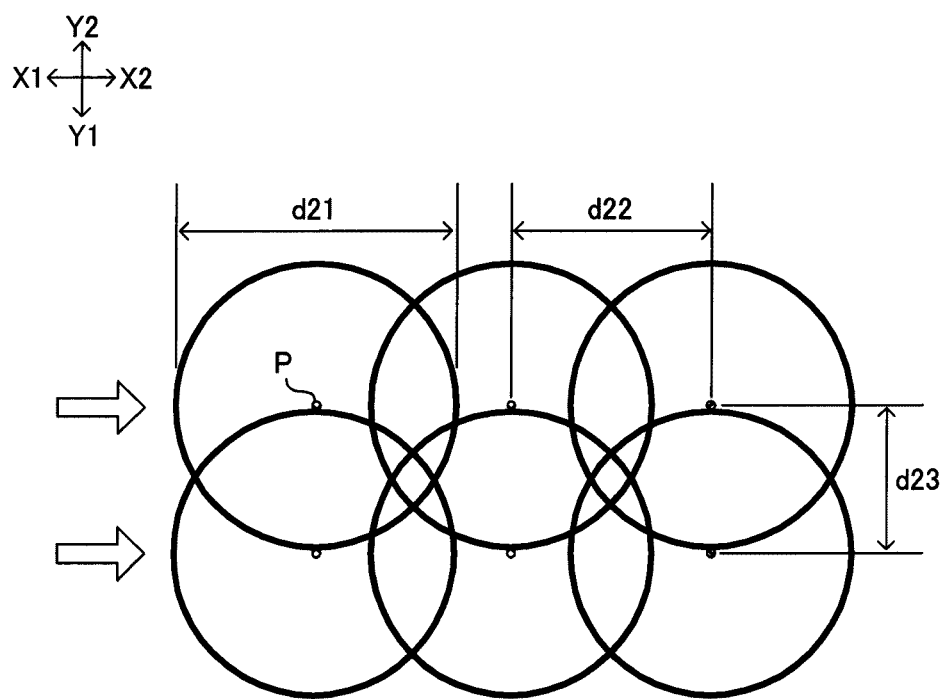
FIG. 17 is a view to illustrate an example of the conditions when moving a laser (more specifically the laser sight)

Here, an example of the conditions is shown for moving a green laser using a galvanomirror. In FIG. 17, spot diameter (d21) of laser light is 30 µm, for example. In this example, the scanning direction of laser light is set along a direction X. Unit moving amount (d22) along a direction X (distance between irradiation centers P of adjacent spots) is 20 µm, for example. Also, unit moving amount (d23) along a direction Y (distance between irradiation centers P of adjacent spots) is 15 µm, for example. The laser scanning speed is 3,000 mm/sec., for example. Namely, when laser light is scanned at 20 µm per shot along a direction X, laser light is irradiated at 150,000 shots per second.

In the following, an example of laser irradiation is described when a laser is irradiated under the above conditions.

In this example, first, a laser is irradiated on a first line, for example, along (0, 0)~(XX, 0), on the X-Y plane of an object. In particular, a laser is irradiated at the first irradiation spot (0, 0), and when the irradiation is finished, the laser is moved by unit moving amount (d22) toward (X2) and irradiated at the next irradiation spot (20, 0). Then, as shown by arrows in FIG. 16A, the laser is irradiated successively at each irradiation spot set along a direction X on the object by repeating laser irradiation and movement toward (X2). Accordingly, when the green laser is finished irradiating along the entire X direction of the object, the laser irradiation along the first line is completed.

Next, a laser is irradiated on a second line, for example along (0, 15)~(XX, 15), on the X-Y plane of the object. In particular, as shown by arrows in FIG. 16A, the green laser is returned to the original point of X coordinate from the last irradiation spot (XX, 0) on the first line, while the Y coordinate is moved toward (Y1) by unit moving amount (d23). Then, the same as the first line, the laser light is scanned starting from the irradiation spot (0, 15) toward (X2). Accordingly, by irradiating successively along each line, the green laser is irradiated on the entire second surface (X-Y plane) of the object.

In the example shown here, a laser is scanned along a direction X which is perpendicular to a longitudinal direction (direction Y) of conductive portions (20a, 20b) (FIG. 1). However, a laser may be scanned along a direction Y which is parallel to a longitudinal direction of conductive portions (20a, 20b) (FIG. 1). Also, without using shading mask 1004, a laser may be irradiated only at the portions to be irradiated by halting laser irradiation where irradiation is not required. In addition, irradiation spots and a method for controlling laser intensity may be determined freely.

In the present embodiment, when a laser is irradiated to remove unnecessary electroless plated film 1001 (FIGS. 16A, 16B), filler (10a) works as a stopper since a green laser is used. Thus, it is thought that excessive removal of insulation layer 10 under electroless plated film 1001 is suppressed. In the following, the mechanism is described with reference to FIG. 18 and others.

Figure 18:
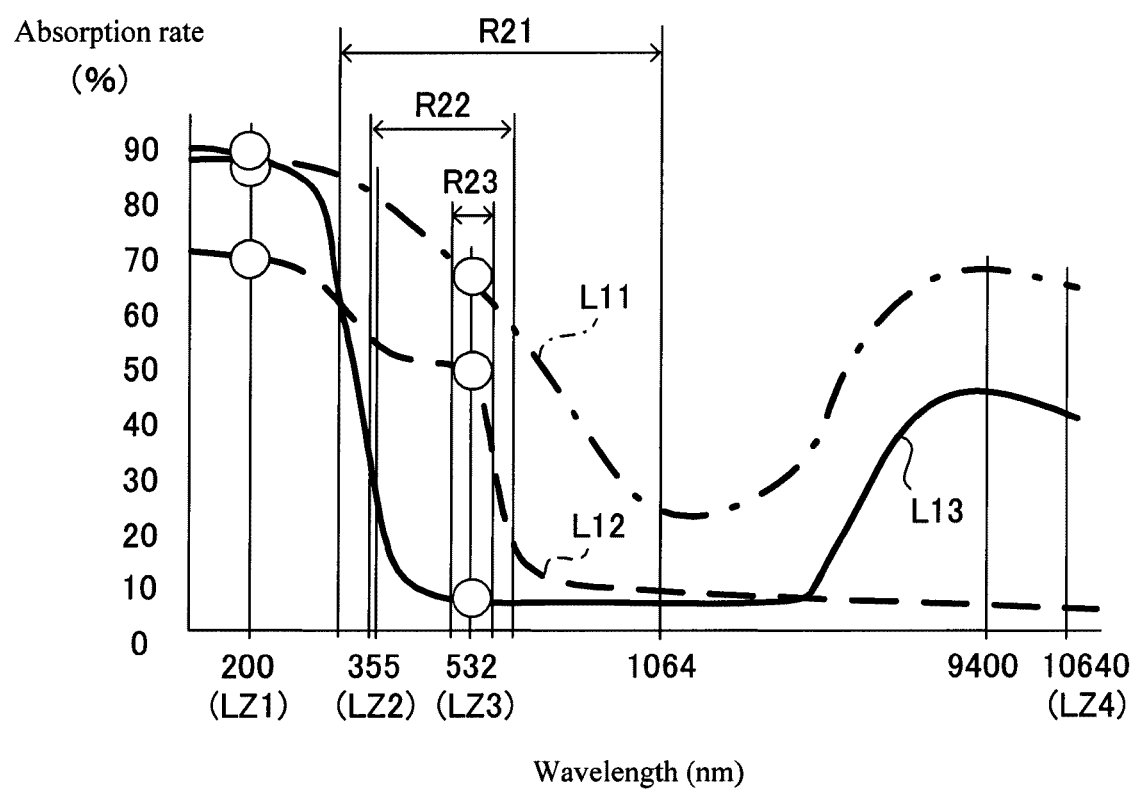
FIG. 18 is a chart showing the relationship between laser wavelength and absorption rate in each material.

FIG. 18 is a graph showing the relationship between a laser wavelength and absorption rates when laser light is irradiated respectively on epoxy resin (line L11), copper (line L12) and silica (line L13). Here, if epoxy resin is replaced with other resins (especially thermosetting resins), it is thought that substantially the same effects are achieved.

First, laser light (LZ3) with an approximate wavelength of 532 nm (green laser) and laser light (LZ4) with an approximate wavelength of 1,064 nm are compared. As the light source for laser light (LZ4), a $CO_2$ laser may be used, for example.

As shown in FIG. 18, the absorption rate of laser light (LZ4) is high in both epoxy resin (line L11) and silica (line L13); however, the absorption rate of laser light (LZ3) is high in epoxy resin (line L11) and low in silica (line L13). Especially, in laser light (LZ3), the absorption rate of silica (line L13) may be kept approximately at 10%. Since insulation layer 10 contains resin (10b) (epoxy resin) as well as filler (10a) (a silica-type filler) in the present embodiment, when a green laser is irradiated on insulation layer 10, it is thought that the decomposition reaction (photochemical reaction) in insulation layer 10 is suppressed from progressing by filler (10a). Namely, when a laser is irradiated to remove unnecessary electroless plated film 1001 (FIGS. 16A, 16B), it is thought that excessive removal of insulation layer 10 under electroless plated film 1001 is suppressed by filler (10a) working as a stopper. To use filler (10a) as a stopper, it is thought that the absorption rate of laser light in resin (10b) is preferred to be seven or more times the absorption rate of laser light in filler (10a).

Also, the absorption rate in copper (line L12) is higher in laser light (LZ3) than in laser light (LZ4). When irradiating a laser to remove electroless plated film 1001 (copper) (FIGS. 16A, 16B), it is thought that the absorption rate of laser light in copper is preferred to be higher to a certain degree. That is because removal of electroless plated film 1001 becomes more efficient, and because modification effects may be expected, for example, rugged features caused by crystalline particle lumps disappear from the surface of electrolytic plated film 22 (FIG. 2) and so forth (see FIG. 25). However, if the absorption rate of laser light in copper is too high, disadvantages such as excessive shaving of copper may occur. For that matter, since a green laser is appropriately absorbed by copper, a green laser is thought to be suitable for laser irradiation to remove electroless plated film 1001. It is thought that the absorption rate of laser light in copper is preferred to be approximately 50%.

Also, laser light with an approximate wavelength of 1,064 nm or less decomposes the object primarily by a photochemical reaction, and laser light with an approximate wavelength of greater than 1,064 decomposes the object primarily by a thermal reaction. If the two reactions are compared, it is thought that energy efficiency is higher in a photochemical reaction which uses light as is than a thermal reaction which uses light by converting it to heat. Accordingly, it is thought that a green laser would also be excellent in energy efficiency.

Next, laser light (LZ1) with an approximate wavelength of 200 nm, laser light (LZ2) (UV laser) with an approximate wavelength of 355 nm and laser light (LZ3) (green laser) with an approximate wavelength of 532 nm are compared. As the light source of laser light (LZ1), an excimer laser may be used, for example. In addition, as laser light (LZ2), the third harmonic of a YAG laser may be used, for example.

Those laser lights (LZ1~LZ3) are thought to be common in that they decompose the object primarily by photochemical reaction. However, regarding the absorption rate in epoxy resin (line L11), copper (line L12) and silica (line L13) respectively, laser light (LZ1) has the highest rate, laser light (LZ2) has the second highest rate, and laser light (LZ3) has the lowest as shown in FIG. 18. More specifically, laser lights (LZ2, LZ3) have absorption rates from highest to lowest in epoxy resin (line L11), copper (line L12) and silica (line L13) in that order. However, laser light (LZ1) has absorption rates from highest to lowest in epoxy resin (line L11), silica (line L13) and copper (line L12) in that order. Moreover, there is little difference in the absorption rate of laser light (LZ1) in epoxy resin (line L11) and in silica (line L13). Therefore, if an excimer laser is used in the previous laser irradiation step (FIGS. 16A, 16B), it is thought that filler (10a) does not function as a stopper.

Figure 19:
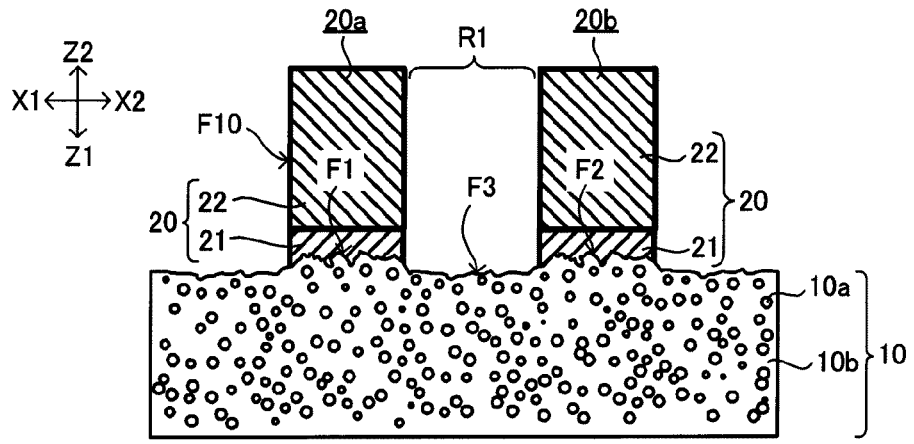
FIG. 19 is a view showing the result when electroless plated film is removed using a green laser in the laser irradiation step in FIGS. 16A and 16B.
Figure 20:
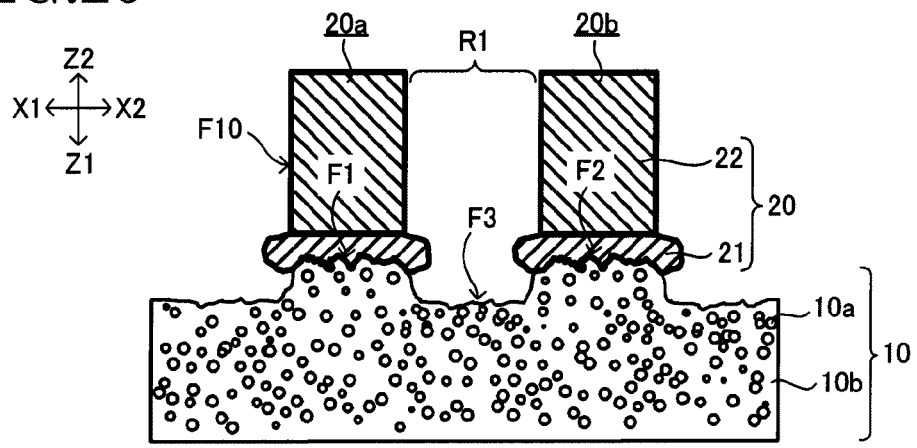
FIG. 20 is a view showing the result when electroless plated film is removed using an excimer laser in the laser irradiation step in FIGS. 16A and 16B.

Specifically, if a green laser is used in the previous laser irradiation step (FIGS. 16A, 16B), since filler (10a) functions as a stopper, it is thought that conductive portions (20a, 20b) (conductive layer 20) are formed without an undercut as shown in FIG. 19. On the other hand, if an excimer laser is used, since filler (10a) does not work as a stopper, there is a concern that undercutting occurs as shown in FIG. 20.

In addition, as shown in FIG. 18, laser light (LZ1) has higher absorption rates in epoxy resin (line L11) and silica (line L13) than in copper (line L12). Accordingly, if an excimer laser is used in the previous laser irradiation step (FIGS. 16A, 16B), residue of electroless plated film 1001 may tend to remain. As a result, there is a concern that side surfaces (F10) of conductive portions (20a, 20b) do not become smooth as shown in FIG. 20. For that matter, if a green laser is used, since the laser light is appropriately absorbed in copper and filler (10a) works as a stopper, it is thought that side surfaces (F10) of conductive portions (20a, 20b) become smooth as shown in FIG. 19. Also, it is thought that the ratio of the absorption rate in copper (line L12) to the absorption rate in silica (line L13) (copper/silica) is preferred to be approximately five to one or greater.

Considering the above, it is thought that the laser light to be used in laser irradiation for removing electroless plated film 1001 (copper)) (FIGS. 16A, 16B) is preferred to be a type which decomposes the object primarily by photochemical reaction, namely laser light with an approximate wavelength of 1,064 nm or shorter. Also, to increase the absorption rate of laser light in copper to a certain degree, it is thought that laser light is preferred to have absorption rates from highest to lowest in epoxy resin (line L11), copper (line L12) and silica (line L13) in that order. Therefore, it is thought that the wavelength of the above laser light is preferred to be in range (R21) in FIG. 18, namely, in an approximate range of 300~1,064 nm. Furthermore, considering filler (10a) to be used as a stopper and the efficiency in removing electroless plated film 1001, it is thought that the wavelength of the above laser light is preferred to be in an approximate range of 350~600 nm (range R22), more preferably in an approximate range of 500~560 nm (range R23).

Light source may be solid lasers, liquid lasers or gas lasers. Specifically, a YAG laser, a $YVO_4$ laser, an argon ion laser or a copper steam laser are thought to be preferable as a light source. For example, by using a second harmonic of a YAG laser or a $YVO_4$ laser, laser light with an approximate wavelength of 532 nm may be obtained, and by using a third harmonic of a YAG laser or a $YVO_4$ laser, laser light with an approximate wavelength of 355 nm may be obtained. Also, by using an argon ion laser, laser light with a wavelength in an approximate range of 488~515 nm may be obtained, and by using a copper steam laser, laser light with a wavelength in an approximate range of 511~578 nm may be obtained. However, the light source is not limited to those, and it is preferred to select a type appropriate to the required wavelength of the laser light.

Figure 21:
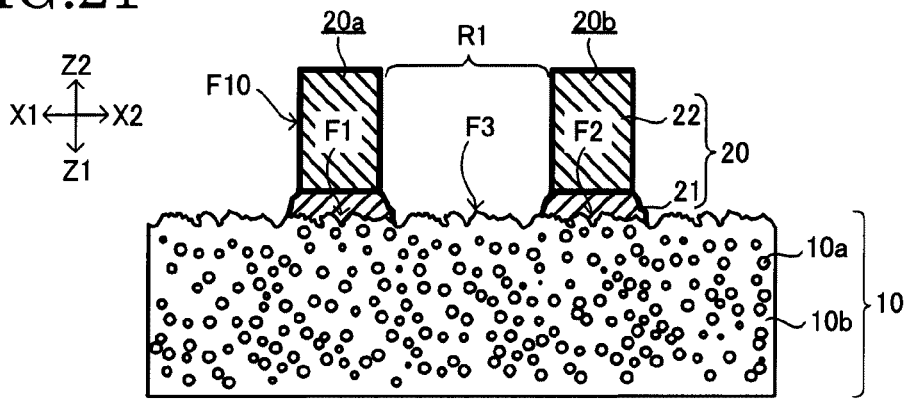
FIG. 21 is a view showing the result when electroless plated film is removed by a wet method instead of by laser irradiation.

So far, an example has been described in which electroless plated film 1001 is removed by using a laser. However, electroless plated film 1001 may be removed by a wet method using an etching solution. In such an example, since a substantially isotropic processing is conducted instead of an anisotropic processing when a laser is used (in particular, primarily processing in directions Z), conductive portions (20a, 20b) tend to be excessively removed due to side etching or the like as shown in FIG. 21. Accordingly, there is a concern that the width (line width) of conductive portions (20a, 20b) results in less than a required width. Also, due to the consequences of side etching, it is thought that side surfaces (F10) of conductive portions (20a, 20b) seldom become smooth.

For that matter, if a laser is used, it is thought that the line width is suppressed from being thinner locally, fine patterns become easier to design, and impedance matching becomes easier to achieve. Furthermore, since the consequences of side etching are fewer, it is thought that smooth features in side surfaces (F10) of conductive portions (20a, 20b) are enhanced.

Figure 22A:
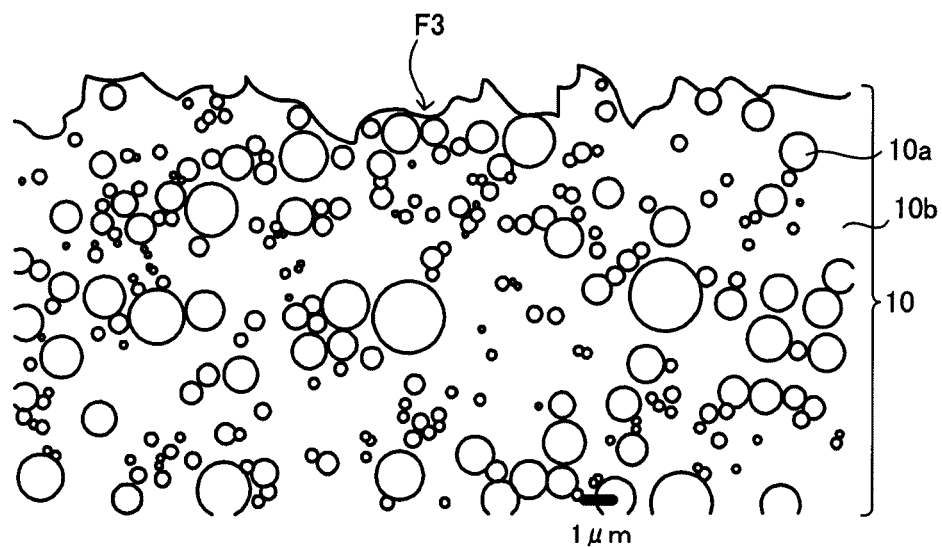
FIG. 22A is a view showing the surface between conductive portions after the unnecessary electroless plated film is removed using a green laser.
Figure 22B:
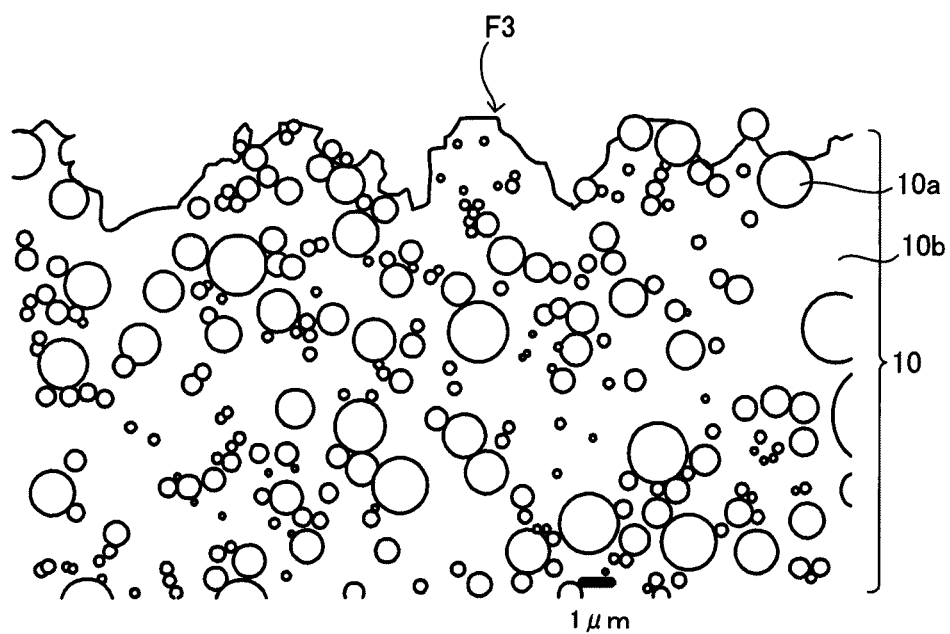
FIG. 22B is a view showing the surface between conductive portions after the unnecessary electroless plated film is removed by a wet method.

In addition, if a laser is used, it is thought that surface (F3) between conductive portion (20a) and conductive portion (20b) (space R1) is less roughened than in a wet method. FIGS. 22A and 22B show such test results.

FIG. 22A is a view showing surface (F3) after electroless plated film 1001 is removed by using a green laser. By contrast, FIG. 22B is a view showing surface (F3) after electroless plated film 1001 is removed by a wet method. FIGS. 22A and 22B are schematic views prepared according to SEM photographs. If both methods are compared as shown in FIGS. 22A and 22B, surface (F3) is less roughened when a green laser is used. If other laser lights are used, it is thought that substantially the same results are achieved.

Figure 23:
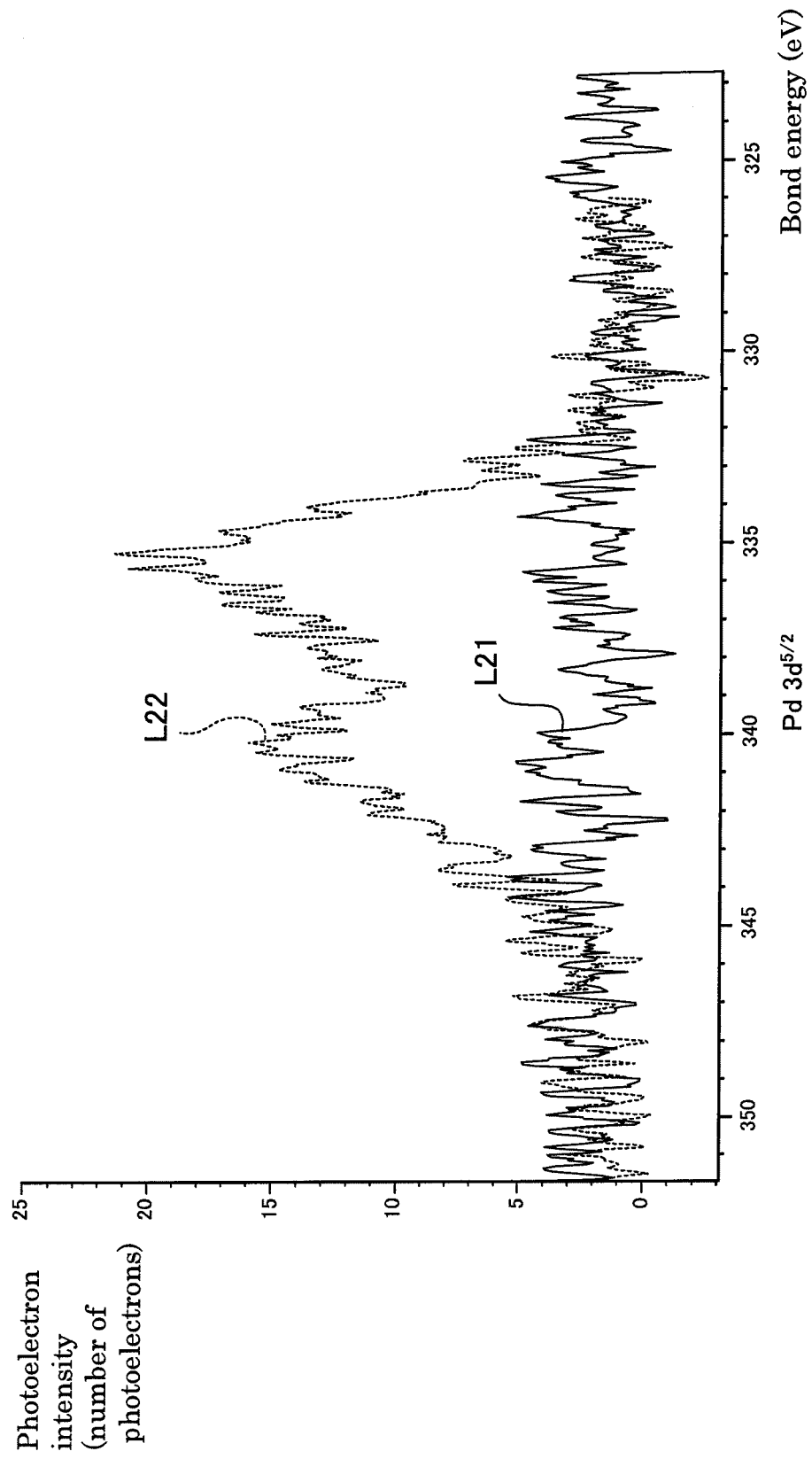
FIG. 23 is a graph showing the results when the palladium amount of each sample on the surface (surface-layer portion) between conductive portions is measured by ESCA.

In addition, if a laser used, it is thought that the catalyst to form electroless plated film 1001 (electroless plated film) is removed from surface (F3) between conductive portion (20a) and conductive portion (20b) (space R1) more completely than in a wet method. FIG. 23 shows such test results.

In those tests, electroless plated film 1001 and electrolytic plated film 1003 were formed on insulation layer 10 (see FIG. 15) after the steps previously shown in FIGS. 10~15, and then unnecessary electroless plated film 1001 was removed.

Accordingly, samples A and B were prepared. In sample A, unnecessary electroless plated film 1001 was removed by using a green laser, and in sample B, unnecessary electroless plated film 1001 was removed by a wet method. Palladium was used as a catalyst when forming electroless plated film 1001 in both samples A and B.

FIG. 23 is a graph showing the results obtained by measuring the remaining amount of palladium on surface (F3) (surface-layer portion) in each of sample A and sample B. As a measuring method, ESCA (Electron Spectroscopy for Chemical Analysis) was employed. Specifically, an X-ray was irradiated on surface (F3) of each sample, and the narrow-band spectrum was measured in an energy range in which a peak specific to palladium appears (especially its $3d^{5/2}$ path). In the graph, the vertical axis shows photoelectron intensity (the number of photoelectrons), and the horizontal axis shows the bond energy of electrons. Also, line (L21) indicates measurement results of sample A, and line (L22) indicates measurement results of sample B.

Since line (L21) does not show any peak, it is found that there is substantially no palladium existing on surface (F3) of sample A. By contrast, since line (L22) shows a peak in a peak position specific to palladium, palladium is found to exist on surface (F3) of sample B. In addition, a quantitative analysis was conducted from peak intensity, area intensity or the like. As a result, the palladium amount on surface (F3) of sample B was 4.39 μg/cm².

From the above test results, it is thought that palladium remains less when a green laser is used than in a wet method. Accordingly, if a green laser is used, it is thought that the risk of an abnormal deposition of Ni or the like on surface (F3) using palladium as nuclei is reduced. If other lasers are used, it is thought that substantially the same effects are achieved.

In addition, since a wet method results in a waste solution, it is thought that using a laser is preferred considering environmental factors.

Figures 24, 25:
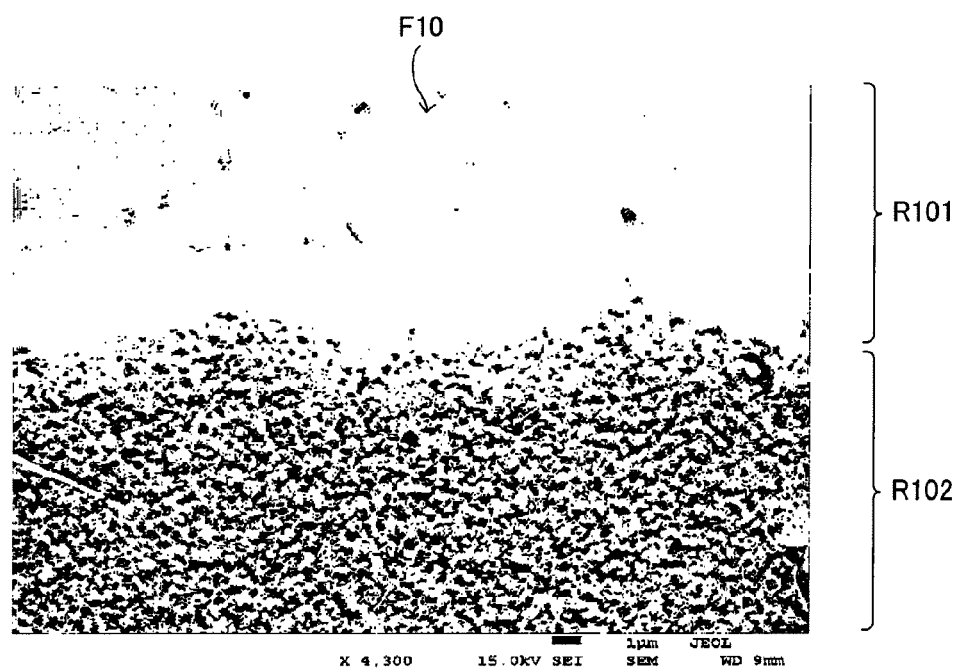
FIG. 24 is a chart showing the results when a green laser is respectively irradiated to four insulation layers containing filler in different amounts.
FIG. 25 is an SEM photograph showing both regions on a side surface of a conductive portion, one region irradiated by a green laser and the other not irradiated by a green laser.

FIG. 24 is a chart showing the results obtained when a green laser is irradiated on four insulation layers 10 containing filler (10a) in different amounts. In the tests, epoxy resin was used as resin (10b), and $SiO_2$ powder was used as filler (10a). The laser scanning speed was set at approximately 50 mm/sec. Also, the laser intensity was set at approximately 60 times that of a manufacturing process.

As shown in FIG. 24, when approximately 0 wt. % and approximately 15 wt. % of filler (10a) were contained in resin (10b) respectively, carbonization was observed on the respective laser irradiation surfaces of resin (10b). By contrast, when approximately 30 wt. % and approximately 50 wt. % of filler (10a) were contained in resin (10b) respectively, carbonization was not observed on the respective laser irradiation surfaces of resin (10b). From those results, it is thought that carbonization of resin (10b) is suppressed by containing filler (10a) at approximately 30 wt. % or greater in resin (10b).

FIG. 25 is an SEM photograph showing both regions, one where a green laser was irradiated (irradiated region 101) and the other where the green laser was not irradiated (non-irradiated region R102), on side surfaces (F10) of conductive portions (20a, 20b) (especially on the outer side of electrolytic plated film 22).

As shown in FIG. 25, a rugged feature of crystalline particle lumps of plating is observed in non-irradiated region (R102), whereas a modification layer is formed in irradiated region (R101), the rugged features of crystalline particle lumps of plating disappear and the surface looks smooth.

Accordingly, it is thought that electrical characteristics improve especially in a high frequency range where a skin effect tends to occur.

In the present embodiment, after a laser is irradiated, the ten-point mean roughness (Rz) (for example, approximately 1.75 μm) on surface (F3) between conductive portions (20a, 20b) (space R1) becomes the same as or smaller than the maximum particle diameter (for example, approximately 3.4 μm) of filler (10a) (a silica-type filler) contained in insulation layer 10. The reasons for that are thought to be as follows: In portions where approximately half or more than half of the resin (10b) surrounding filler (10a) is removed by laser irradiation, recessed portions formed when filler (10a) falls off resin (10b) appear on surface (F3); whereas in portions where approximately less than half of the resin (10b) surrounding filler (10a) is removed by laser irradiation, projected portions formed when filler (10a) remaining in resin (10b) is exposed appear on surface (F3).

As described so far, by laser irradiation steps (FIGS. 16A, 16B) unnecessary electroless plated film 1001, namely, electroless plated film 1001 under plating resist 1002 (see FIG. 14), is removed. As a result, conductive layer 20 is formed having a conductive pattern previously shown in FIG. 1. After that, by further forming upper insulation layer 30 on insulation layer 10 by screen printing, lamination or the like, for example, wiring board 100 is completed (especially the structure shown in FIGS. 1, 2).

So far, a wiring board and its manufacturing method according to an embodiment of the present invention have been described. However, the present invention is not limited to the above embodiment.

Figure 26:
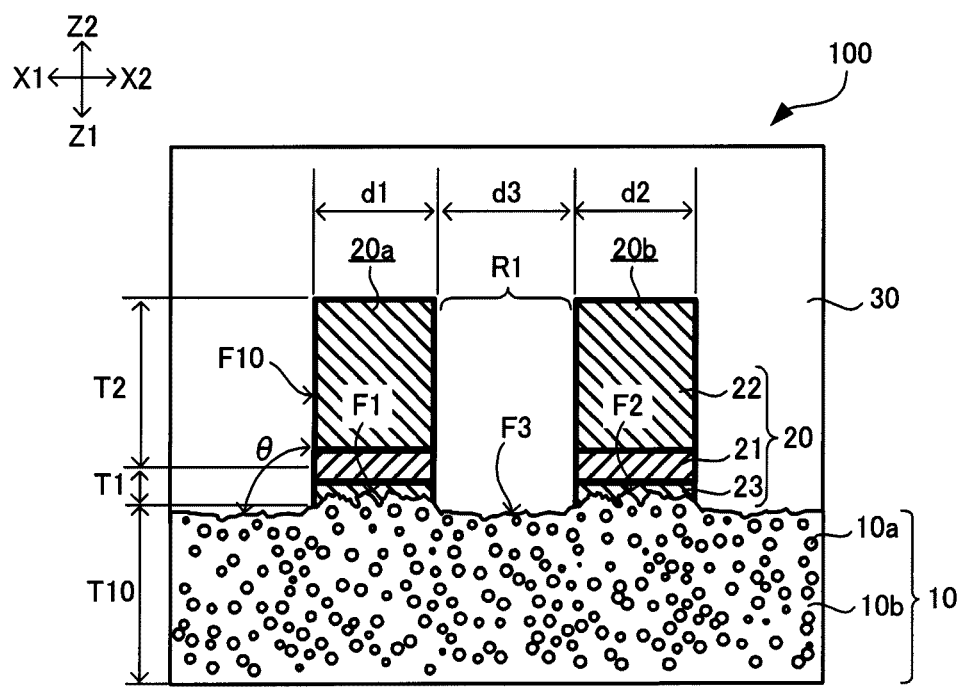
FIG. 26 is a cross-sectional view of an example showing a wiring board in which a conductive layer formed on the roughened surface of an insulation layer has a triple-layer structure of metal foil, electroless plated film and electrolytic plated film.

Conductive layer 20 formed on the roughened surface of insulation layer 10 is not limited to a double-layer structure of electroless plated film 21 and electrolytic plated film 22. For example, as shown in FIG. 26 (a cross-sectional view corresponding to FIG. 2), conductive layer 20 may be a triple-layer structure of metal foil 23, electroless plated film 21 and electrolytic plated film 22 laminated in that order from the side of insulation layer 10. Metal foil 23, electroless plated film 21 and electrolytic plated film 22 are made of copper, for example.

Figure 27:
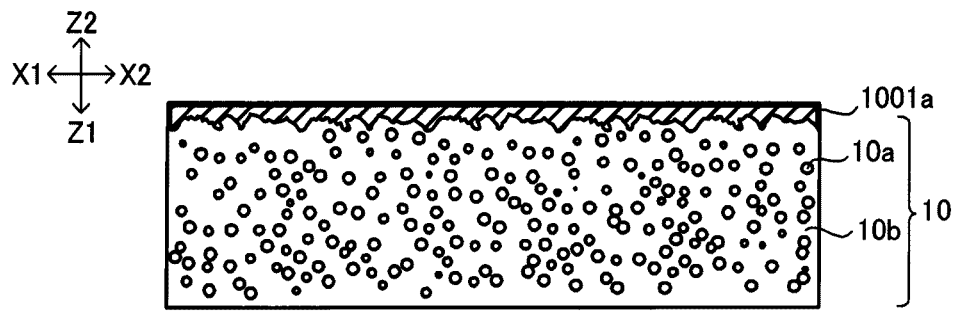
FIG. 27 is a view to illustrate a step for preparing an insulation layer having metal foil on its roughened surface.

For wiring board 100 in an example shown in FIG. 26, insulation layer 10 is prepared, having metal foil (1001a) (such as copper foil) on a second surface (roughened surface) as shown in FIG. 27, for example. Metal foil (1001a) is formed by lamination, for example, on the second surface (roughened surface) of insulation layer 10.

Figure 28:
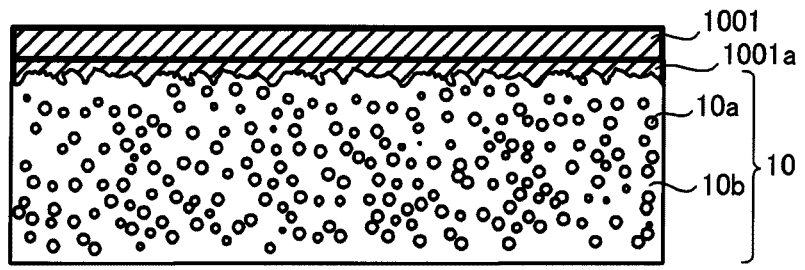
FIG. 28 is a view to illustrate a step for forming electroless plated film on the metal foil after the step in FIG. 27.

As shown in FIG. 28, electroless copper-plated film 1001, for example, is formed on metal foil (1001a) by the same method as in the above embodiment, for example.

Figure 29:
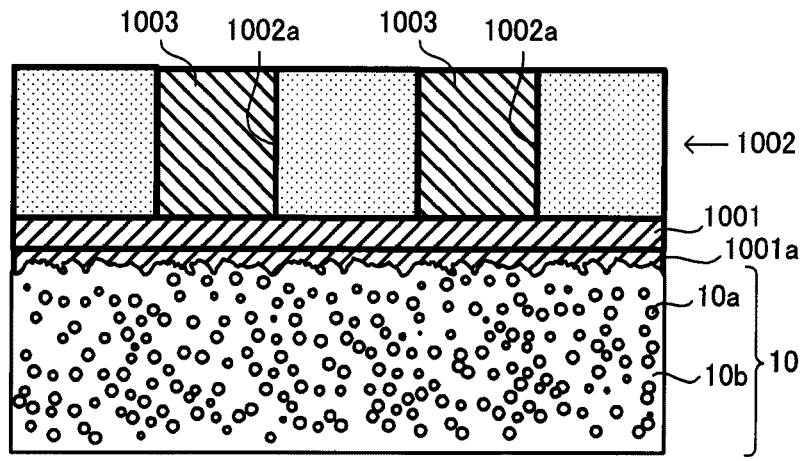
FIG. 29 is a view to illustrate a step for forming electrolytic plated film on portions of the electroless plated film after the step in FIG. 28.

As shown in FIG. 29, electrolytic copper-plated film 1003, for example, is formed on portions of electroless plated film 1001 using plating resist 1002 by the same method as in the above embodiment, for example. Then, plating resist 1002 is removed.

Unnecessary electroless plated film 1001 and metal foil (1001a), namely, electroless plated film 1001 and metal foil (1001a) under plating resist 1002 (see FIG. 29), are removed by the same laser irradiation process as in the above embodiment, for example. Accordingly, conductive layer 20 having a conductive pattern as previously shown in FIG. 1 is obtained. Furthermore, by forming upper insulation layer 30 on insulation layer 10 by screen printing, lamination or the like, for example, wiring board 100 is completed (especially the structure shown in FIG. 26).

The number of layers in conductive layer 20 formed on the roughened surface of insulation layer 10 is not limited to two or three. For example, conductive layer 20 may be formed with four or more layers.

Conductive layer 20 may have any type of conductive pattern.

Figure 30:
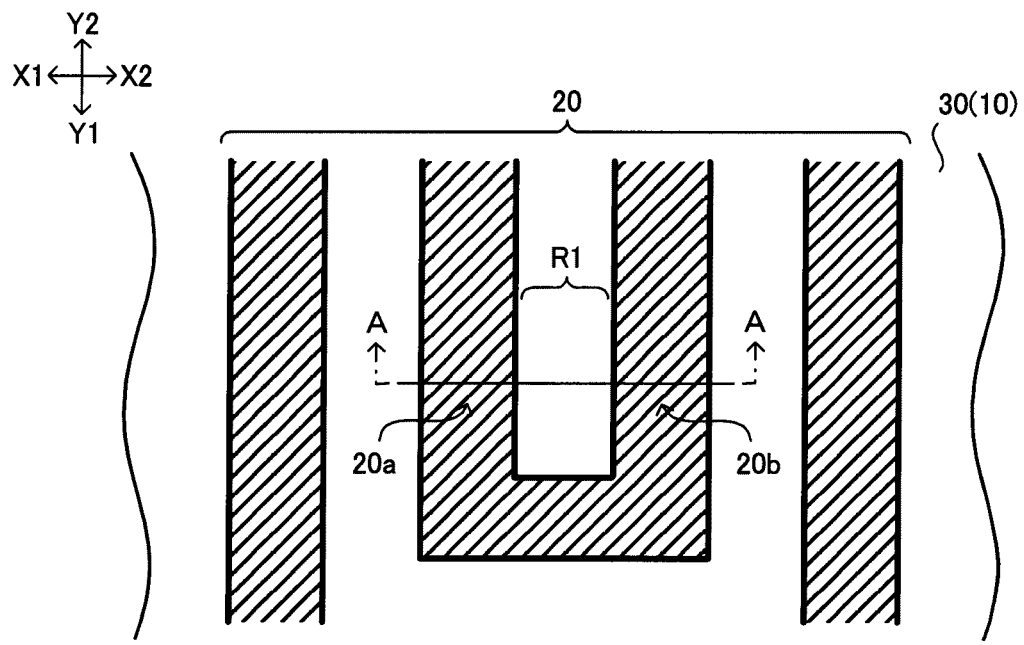
FIG. 30 is a view of a first example showing the conductive pattern of a conductive layer.

For example, as shown in FIG. 30 (a plan view corresponding to FIG. 1), conductive layer 20 may have a U-shaped conductive pattern, and conductive portion (20a) and conductive portion (20b) may be connected to each other.

Figure 31:
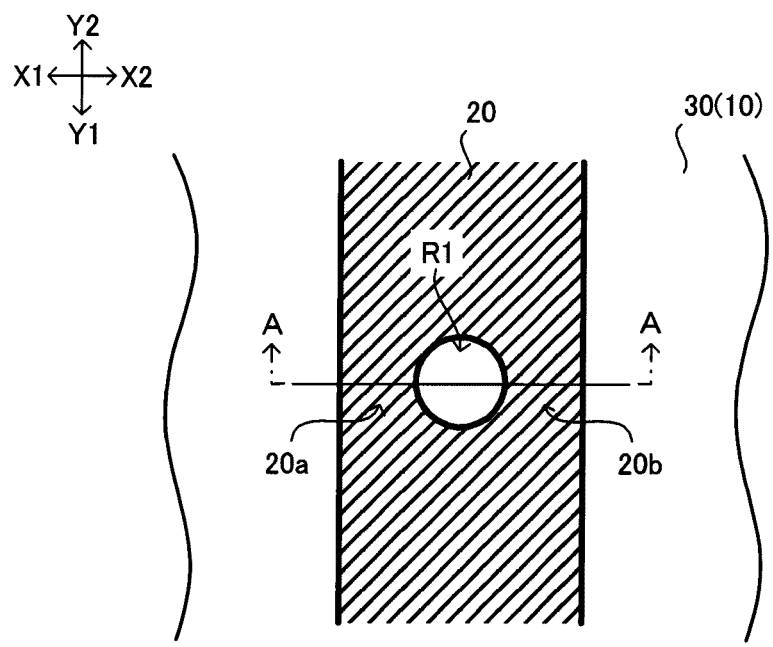
FIG. 31 is a view of a second example showing the conductive pattern of a conductive layer.

Also, as shown in FIG. 31 (a plan view corresponding to FIG. 1), space (R1) in conductive layer 20 may be a hole.

Figure 32:
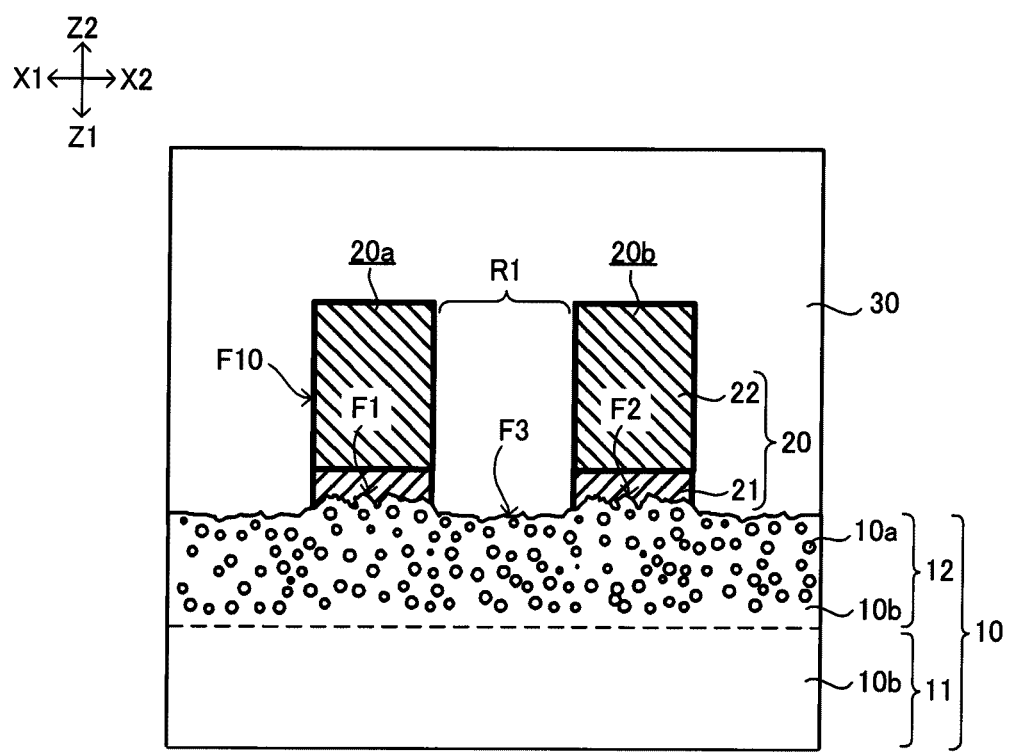
FIG. 32 is a view of an example showing a wiring board having a filler layer on the surface-layer portion of an insulation layer.

It is not always required to disperse filler (10a) in substantially the entire insulation layer 10. For example, as shown in FIG. 32 (a cross-sectional view corresponding to FIG. 2), insulation layer 10 may have first layer 11 (resin layer) which does not contain filler (10a) and second layer 12 (filler layer) which contains filler (10a). In this example, first layer 11 is primarily made of resin (10b) and second layer 12 is primarily made of filler (10a) and resin (10b). Second layer 12 is formed on first layer 11. Alternatively, multiple resin layers and multiple filler layers may be formed alternately.

As the material for conductive layer 20, other conductors may also be used instead of copper. As long as substantially the same relationships as those shown in FIG. 18 are obtained, it is thought that substantially the same effects as those described earlier are achieved.

Regarding other factors, structures of wiring board 100 as well as type, performance, dimensions, quality, configuration, number of layers, positioning and so forth of the elements of such structures, may be modified freely within a scope that does not deviate from the gist of the present invention.

The method for manufacturing wiring board 100 is not limited to the contents of the above embodiment. The order and the contents may be modified freely within a scope that does not deviate from the gist of the present invention. Also, some steps may be omitted according to requirements.

The above embodiment and its modifications may be combined freely. It is preferred to select a proper combination according to usage or the like. For example, the structure shown in FIG. 32 may be employed in the structure in FIG. 26.

A wiring board according to one aspect of the present invention has an insulation layer containing a silica-type filler where at least one of its surfaces is roughened and a conductive layer formed on the roughened surface. On the roughened surface of such a wiring board, the roughness of the surface between a first conductive portion and a second conductive portion positioned adjacent on the conductive layer is set less than at least either the roughness of the surface under the first conductive portion or the roughness of the surface under the second conductive portion.

A method for manufacturing a wiring board according to another aspect of the present invention includes the following: preparing an insulation layer containing a silica-type filler where at least one of its surfaces is roughened; forming electroless plated film on the roughened surface by means of metal foil or without metal foil; forming electrolytic plated film on portions of the electroless plated film; and by irradiating a laser on the electroless plated film exposed in a region where the electrolytic plated film is not formed, removing the exposed electroless plated film while the silica-type filler works as a stopper.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
   an insulation layer comprising a resin and a silica-type filler and having a roughened surface; and
   a conductive layer formed on the roughened surface of the insulation layer and having a first conductive portion and a second conductive portion positioned adjacent to the first conductive portion,
   wherein the roughened surface is recessed between the first conductive portion and the second conductive portion with respect to at least one of a portion of the roughened surface under the first conductive portion and a portion of the roughened surface under the second conductive portion.

2. The wiring board according to claim 1, wherein the conductive layer comprises an electroless plated film and an electrolytic plated film, and a portion of the roughened surface of the insulation layer between the first conductive portion and the second conductive portion has a catalyst for forming the electroless plated film in an amount of approximately 0.05 μg/cm² or less.

3. The wiring board according to claim 2, wherein the electroless plated film is made of copper and the catalyst is palladium.

4. The wiring board according to claim 1, wherein the conductive layer formed on the roughened surface of the insulation layer comprises an electroless plated film and an electrolytic plated film, the conductive layer has a conductor portion comprising the electroless plated film and the electrolytic plated film, and the conductor portion of the conductive layer has a side surface which makes an angle of 90 degrees or greater with the roughened surface.

5. The wiring board according to claim 1, further comprising a modification layer formed on an electrolytic plated film, wherein the conductive layer formed on the roughened surface of the insulation layer comprises an electroless plated film and an electrolytic plated film, and the modification layer is formed on the electrolytic plated film.

6. The wiring board according to claim 1, wherein the resin of the insulation layer is a thermosetting resin, and the silica-type filler is in an amount of at approximately 30 wt. % or greater in the insulation layer.

7. The wiring board according to claim 1, wherein the insulation layer has a thickness which is in a range of approximately 5~200 μm.

8. The wiring board according to claim 1, further comprising an upper insulation layer formed on the insulation layer such that the first conductive portion and the second conductive portion are coated by the upper insulation layer.

9. The wiring board according to claim 1, wherein a distance between the first conductive portion and the second conductive portion is set at approximately 10 μm or less.

10. The wiring board according to claim 1, wherein at least one of the first conductive portion and the second conductive portion has a width which is set at approximately 10 μm or less.

11. The wiring board according to claim 1, wherein the silica-type filler is made of a silicate mineral.

12. The wiring board according to claim 1, wherein approximately 50 wt. % or more of the silica-type filler is spherical silica.

13. The wiring board according to claim 1, wherein the roughened surface of the insulation layer has a roughness under the first conductive portion, a roughness under the second conductive portion, and a roughness between the first conductive portion and the second conductive portion, and the roughness between the first conductive portion and the second conductive portion is set less than at least one of the roughness under the first conductive portion and the roughness under the second conductive portion.

14. The wiring board according to claim 13, wherein the roughness between the first conductive portion and the second conductive portion has a ten-point mean roughness which is set approximately half or less than half of a ten-point mean roughness of at least one of the roughness under the first conductive portion and the roughness under the second conductive portion.

15. The wiring board according to claim 13, wherein the roughness between the first conductive portion and the second conductive portion has a ten-point mean roughness which is set the same as or less than the maximum particle diameter of the silica-type filler of the insulation layer.

16. A method for manufacturing a wiring board, comprising:
   preparing an insulation layer comprising a resin and a silica-type filler and having a roughened surface;
   forming an electroless plated film on the roughened surface of the insulation layer;
   forming an electrolytic plated film on a plurality of portions of the electroless plated film; and
   removing the electroless plated film except the portions of the electroless plated film having the electrolytic plated film formed thereon by laser irradiation such that the silica-type filler works as a stopper.

17. The method for manufacturing a wiring board according to claim 16, wherein the laser irradiation is performed on an entire portion of the roughened surface of the insulation layer.

18. The method for manufacturing a wiring board according to claim 16, wherein the forming of the electroless plated film comprises forming a metal foil on the roughened surface of the insulation layer, and the metal foil, the electroless plated film and the electrolytic plated film are made of copper, and the laser irradiation is performed by using laser light with a wavelength in a range of approximately 350~600 nm.

19. The method for manufacturing a wiring board according to claim 18, wherein the laser irradiation is performed by using laser light with a wavelength in a range of approximately 500~560 nm.

20. The method for manufacturing a wiring board according to claim 16, wherein the forming of the electroless plated film comprises forming a metal foil on the roughened surface of the insulation layer, the metal foil, the electroless plated film and the electrolytic plated film are made of copper, and the laser irradiation is performed by using one of a YAG laser, a YVO₄ laser, argon ion laser and copper vapor laser.

* * * * *